(12) United States Patent
Sugisaka

(10) Patent No.: US 8,994,886 B2
(45) Date of Patent: Mar. 31, 2015

(54) DISPLAY DEVICE AND TELEVISION DEVICE

(75) Inventor: Akane Sugisaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 71 days.

(21) Appl. No.: 13/988,622

(22) PCT Filed: Nov. 18, 2011

(86) PCT No.: PCT/JP2011/076692
§ 371 (c)(1),
(2), (4) Date: May 21, 2013

(87) PCT Pub. No.: WO2012/070498
PCT Pub. Date: May 31, 2012

(65) Prior Publication Data
US 2013/0235279 A1   Sep. 12, 2013

(30) Foreign Application Priority Data
Nov. 25, 2010   (JP) ................. 2010-262498

(51) Int. Cl.
*G02F 1/136* (2006.01)
*G02F 1/1362* (2006.01)
*G02F 1/1345* (2006.01)
*H01L 27/12* (2006.01)
*G02F 1/1343* (2006.01)

(52) U.S. Cl.
CPC ........ *G02F 1/136286* (2013.01); *G02F 1/1345* (2013.01); *G02F 1/13452* (2013.01); *H01L 27/124* (2013.01); *G02F 1/1343* (2013.01); *G02F 1/136259* (2013.01); *G02F 2001/136263* (2013.01); *G02F 2201/122* (2013.01)
USPC .......................................... 349/40

(58) Field of Classification Search
USPC .......................................... 349/40
See application file for complete search history.

(56) References Cited

U.S. PATENT DOCUMENTS

| 5,841,490 | A | * | 11/1998 | Matsuo | 349/40 |
| 6,088,073 | A | * | 7/2000 | Hioki et al. | 349/40 |
| 6,184,948 | B1 | * | 2/2001 | Lee | 349/54 |
| 6,801,265 | B2 | * | 10/2004 | Choi et al. | 349/40 |

(Continued)

FOREIGN PATENT DOCUMENTS

| JP | 60-236266 A | 11/1985 |
| JP | 5-259300 A | 10/1993 |

(Continued)

OTHER PUBLICATIONS

Official Communication issued in International Patent Application No. PCT/JP2011/076692, mailed on Dec. 13, 2011.

*Primary Examiner* — James Dudek
(74) *Attorney, Agent, or Firm* — Keating & Bennett, LLP

(57) ABSTRACT

A liquid crystal display device (display device) 10 according to the present invention is provided with a display area AA that displays an image, and a non-display area NAA surrounding the display area AA. The non-display area NAA includes at least a backup wire 32 as a first wire and a source wire 24 as a second wire arranged on an upper side with respect to the backup wire 32 and intersecting with the backup wire 32. The backup wire 32 includes an intersecting portion 32CP intersecting with the source wire 24. The intersecting portion 32CP includes a crank portion 35 cranked at a side edge of the intersecting portion 32CP a second wire extending direction in which the source wire 24 extends.

14 Claims, 31 Drawing Sheets

(56) References Cited

U.S. PATENT DOCUMENTS

| | | |
|---|---|---|
| 7,092,067 B2 * | 8/2006 | Kweon et al. ............... 349/187 |
| 8,330,883 B2 * | 12/2012 | Tsubata et al. ............... 349/38 |
| 2003/0227579 A1 | 12/2003 | Nakahori et al. |
| 2005/0161670 A1 | 7/2005 | Kimura |
| 2009/0091671 A1 | 4/2009 | Tsubata et al. |
| 2012/0057091 A1 | 3/2012 | Kawabata et al. |

FOREIGN PATENT DOCUMENTS

| | | |
|---|---|---|
| JP | 2004-13003 A | 1/2004 |
| JP | 2005-164854 A | 6/2005 |
| JP | 2007-25281 A | 2/2007 |
| JP | 2007-156338 A | 6/2007 |
| WO | 2008/010334 A1 | 1/2008 |
| WO | 2010/134439 A1 | 11/2010 |

* cited by examiner

FIG.1
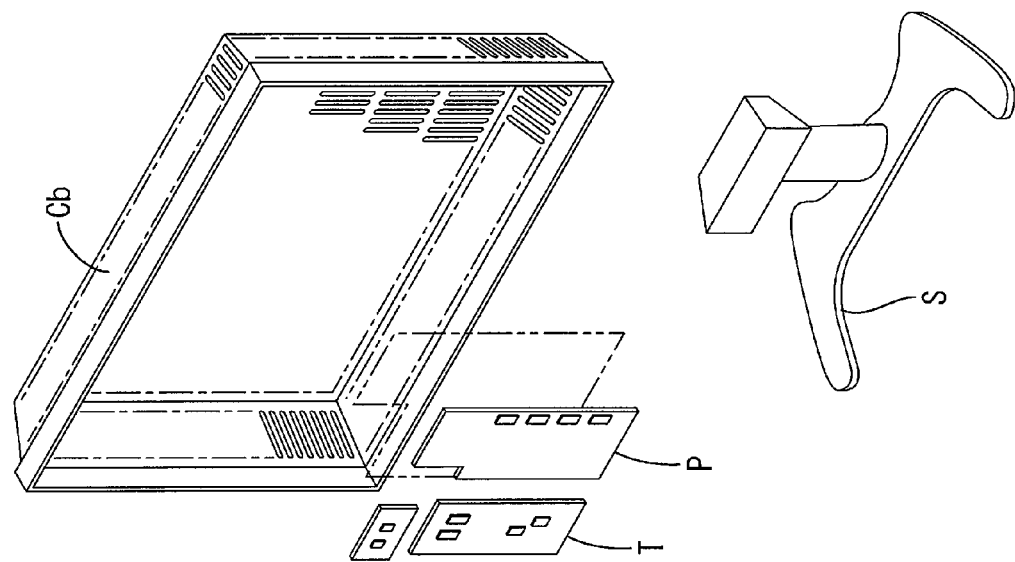
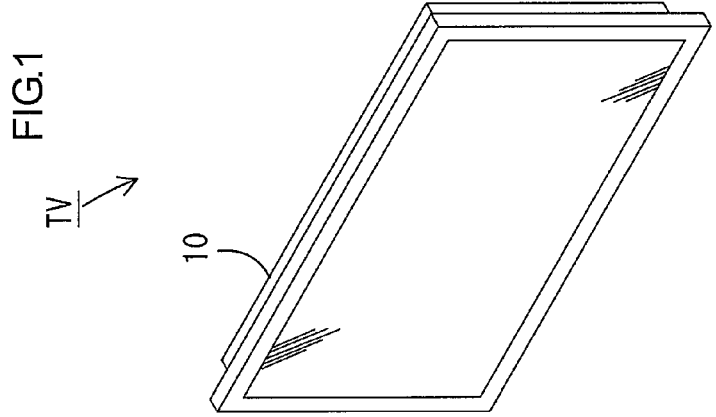
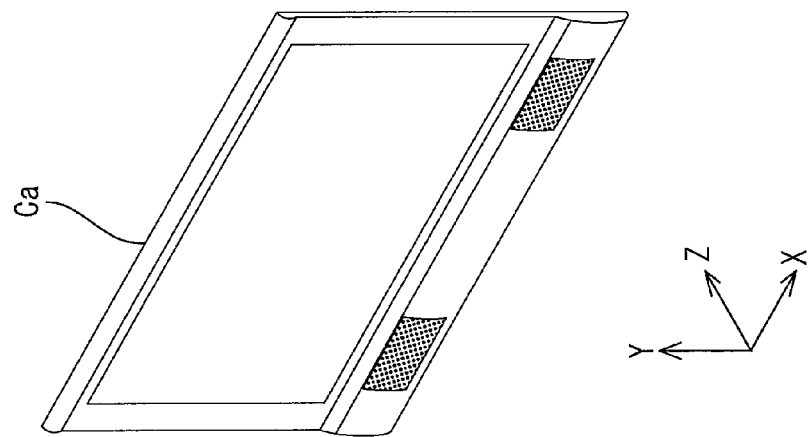

DISPLAY DEVICE AND TELEVISION DEVICE

TECHNICAL FIELD

The present invention relates to a display device and a television device.

BACKGROUND ART

A liquid crystal panel used in a liquid crystal display device includes a pair of glass substrates sandwiching a liquid crystal layer. One of the glass substrates is an array substrate provided with TFTs as active components. On the array substrate, a plurality of gate wires and a plurality of source wires are disposed in a lattice within a display area, with the TFTs disposed at the intersecting portions of the gate wires and the source wires. In each of areas surrounded by the gate wires and the source wires, a pixel electrode is disposed, forming a pixel as a display unit.

In an inverted staggered TFT structure, the source wires disposed on a relatively upper side overlie the gate wires on a lower side as the source wires and the gate wires intersect with one another. Thus, the source wires have overlying portions. When the source wires are formed by depositing a metal material, such as Cr, for example by sputtering, the Cr film formed at the overlying portion tends to become coarse, and the Cr film may not have a sufficient film thickness at the overlying portions. In this case, when wet etching is performed by using a resist pattern as a mask after deposition of the metal film forming the source wires, etching for the overlying portions rapidly proceeds and, as a result, the source wires may be disconnected. This problem is addressed in Patent Document 1 indicated below.

Patent Document 1: Japanese Unexamined Patent Publication No. 2005-164854

Problem to be Solved by the Invention

Patent Document 1 describes a configuration preventing disconnection of source wires disposed in a display area of a liquid crystal display device. However, the disclosure does not focus on a non-display area surrounding the display area. If disconnection is caused in wires intersecting with one another in the non-display area, a line defect may be caused in a wire in the display area to which the disconnected wires in the non-display area are connected, resulting in a significant decrease in display quality. In recent years, there has been the growing demand for a narrower frame for the liquid crystal display device. To meet such demand, the width of the frame-shaped non-display area surrounding the display area needs to be decreased. However, if the wires to be disposed in the non-display area are made thinner to achieve the decrease in width, disconnection may tend to more easily occur.

DISCLOSURE OF THE PRESENT INVENTION

The present invention was made in view of the above circumstances, and an object of the present invention is to prevent disconnection in the non-display area.

Means for Solving the Problem

A display device according to the present invention includes a display area configured to display an image, a non-display area surrounding the display area. The non-display area includes at least a first wire and a second wire disposed on an upper side with respect to the first wire and intersecting with the first wire. The first wire includes an intersecting portion intersecting with the second wire. The intersecting portion includes a crank portion cranked at a side edge thereof in a second direction in which the second wire extends.

The second wire disposed on the relatively upper side includes an intersecting portion intersecting with the first wire, and the intersecting portion of the second wire overlies the first wire. During patterning the second wire on the upper side of the first wire, an etchant used for etching the second wire may infiltrate the intersecting portion of the second wire (overlying portion) from the outside along the side edge of the first wire. As a result, the intersecting portion of the second wire may be etched throughout the width thereof, causing disconnection of the second wire.

According to the present invention, at the side edge of the intersecting portion of the first wire intersecting with the second wire, the crank portion bent in the second wire extending direction is provided, thereby increasing length of the etchant infiltration path by the length of the crank portion. Thus, the problem of the intersecting portion of the second wire being etched by the etchant throughout the width thereof can be made difficult to occur, whereby the disconnection of the second wire is made difficult to occur.

The first wire and the second wire are disposed in the non-display area of the display device. When the second wire is connected to a wire in the display area directly or indirectly, in the event of disconnection in the second wire, the wire in the display area cannot be supplied with a predetermined voltage, for example, possibly resulting in a significant decrease in display quality. However, according to the configuration described above, disconnection of the second wire is prevented. Thus, the display quality can be effectively prevented from being adversely affected. The non-display area, in which the first wire and the second wire are disposed, has a frame shape surrounding the display area. When it is desired to make the frame shape of the display device narrower, the width of the frame shape may be decreased, which further requires the first wire and the second wire to be thinner, resulting in a greater likelihood of disconnection. However, according to the configuration described above, disconnection of the second wire is prevented, which is extremely useful in achieving a narrower frame shape.

Preferred embodiments of the present invention may include the following.

(1) The crank portion may include at least a recess recessed at the side edge of the intersecting portion of the first wire in the second wire extending direction. In this way, the parasitic capacity that can be formed between the first wire and the second wire may be decreased.

(2) The recess may extend in the second wire extending direction not more than one half a line width of the first wire. If the recess extends more than one half the line width of the first wire, wire resistance may become excessive. However, by making the recess not to extend more than one half the line width of the first wire, the wire resistance of the first wire can be maintained at a low level.

(3) The crank portion may include at least a protrusion protruding from the side edge of the intersecting portion of the first wire in the second wire extending direction. In this way, the wire resistance of the first wire can be decreased.

(4) The crank portion may include a plurality of crank portions. Each of the crank portions may cranked at each of the side edges of the intersecting portion of the first wire. In this way, the etchant infiltration path can be increased in length at both of the side edges of the intersecting portion of the first wire, whereby disconnection of the second wire can be more reliably prevented.

(5) The crank portions may include a recess recessed at one of the side edges of the intersecting portion of the first wire in the second wire extending direction and a protrusion protruding from another one of the side edges in the second direction. In this way, the change in the area of the intersecting portion of the first wire due to the provision of the crank portion can be minimized or eliminated, whereby the change in parasitic capacity that may be formed between the first wire and the second wire can be minimized or eliminated. Thus, a voltage value supplied to the first wire or the second wire, for example, can be controlled in an advantageous manner. Further, compared with the case where the recesses are provided at both of the side edges of the intersecting portion, the wire resistance of the first wire can be maintained at a low level.

(6) The recess and the protrusion may be substantially equal in area. In this way, the change in the area of the intersecting portion of the first wire due to the provision of the crank portions can be substantially eliminated, whereby the change in parasitic capacity that can be formed between the first wire and the second wire can be substantially eliminated. Thus, the voltage value supplied to the first wire or the second wire, for example, can be more advantageously controlled.

(7) The recess and the protrusion may overlap at least partially with each other with respect to a first wire extending direction in which the first wire extends. In this way, at the portion of the first wire where the recess and the protrusion overlap with each other with respect to the first wire extending direction, the change in the line width due to the provision of the crank portion can be minimized or eliminated. Thus, disconnection due to a pattern defect and the like during the patterning of the first wire can be made difficult to occur.

(8) The recess and the protrusion may extend substantially an equal distance in the second wire extending direction. In this way, the line width of the first wire at the portion where the recess and the protrusion overlap with each other with respect to the first wire extending direction can be made equal to the line width of the first wire at portions where the recess and the protrusion are not formed. Thus, it becomes more difficult for disconnection due to a pattern defect and the like to occur during the patterning of the first wire.

(9) A center of the recess and a center of the protrusion in the first wire extending direction may be substantially aligned with each other. In this way, the recess and the protrusion can overlap with each other maximally with respect to the first wire extending direction. Thus, disconnection due to a pattern defect and the like during the patterning of the first wire can be made more difficult to occur.

(10) The recess and the protrusion may extend substantially an equal distance in the first wire extending direction. In this way, the line width of the first wire can be limited to two different widths at most, one for the portion where the recess and the protrusion are formed, and the other for the portions where the recess and the protrusion are not formed. If the recess and the protrusion had different lengths with respect to the first wire extending direction, the first wire would have three different widths at most. Compared to such a case, in the case with the recess and protrusion of the same length, the shape of the first wire can be simplified. Thus, it becomes more difficult for disconnection due to a pattern defect and the like to occur during the patterning of the first wire.

(11) A center of the crank portion at one of the side edges and a center of the crank portion at another one of the side edges in the first extending direction may be substantially aligned with each other. In this way, even when the intersecting portion of the second wire is eroded by the etchant, the remaining intersecting portion of the second wire can more readily maintain a straight shape. Thus, the wire resistance of the second wire can be maintained at a low level.

(12) The display area may include a switching component with an electrode, and an electrode wire connected to the electrode. The non-display area may include an extension portion of the electrode wire, and a backup wire intersecting with the extension portion of the electrode wire. The first wire may be the backup wire, and the second wire may be the electrode wire. In this way, in the event of disconnection in the electrode wire, the electrode wire can be repaired by short-circuiting the extension portion of the electrode wire with the backup wire at the intersecting portion. By providing the crank portion at the intersecting portion of the backup wire intersecting with the extension portion of the electrode wire, disconnection at the intersecting portion in the extension portion of the electrode wire can be prevented. Thus, a line defect of the electrode wire can be prevented, whereby high display quality can be obtained.

(13) The display area may include a switching component with a source electrode, a gate electrode, and a drain electrode; a source wire connected to the source electrode; a gate wire connected to the gate electrode and intersecting with the source wire; a pixel electrode connected to the drain electrode; a storage capacitor wire running parallel with the gate wire and opposed to the pixel electrode to form a capacitance therewith; and a connecting wire running parallel with the source wire and connected to the storage capacitor wire. The non-display area may include an extension portion of the source wire; an extension portion of the connecting wire; and a routing wire intersecting with the extension portions of the source wire and the connecting wire and connected to the connecting wire. The first wire may be the routing wire. The second wire may be the source wire. In this way, the storage capacitor wire that forms a capacitance with the pixel electrode can be supplied with a reference voltage from an external circuit via the connecting wire and the routing wire, for example. By providing the crank portion at the intersecting portion of the routing wire intersecting with the extension portion of the source wire, disconnection at the intersecting portion in the extension portion of the source wire can be prevented. Thus, the development of a line defect in the source wire can be prevented, whereby high display quality can be obtained.

(14) The display area may include a switching component with a source electrode, a gate electrode, and a drain electrode; a source wire connected to the source electrode; a gate wire connected to the gate electrode and intersecting with the source wire; a pixel electrode connected to the drain electrode; and a storage capacitor wire running parallel with the gate wire and opposed to the pixel electrode to form a capacitance therewith. The non-display area may include an extension portion of the storage capacitor wire, and a routing wire intersecting with the extension portion of the storage capacitor wire and connected to the extension portion of the storage capacitor wire. The first wire may be the storage capacitor wire. The second wire may be the routing wire. In this way, the storage capacitor wire forming a capacitance with the pixel electrode can be supplied with a reference voltage from an external circuit via the routing wire, for example. By providing the crank portion at the intersecting portion of the extension portion of the storage capacitor wire intersecting with the routing wire, disconnection at the intersecting portion of the routing wire can be prevented. Thus, a line defect in the storage capacitor wire connected to the routing wire can be prevented, whereby high display quality can be obtained.

(15) The second wire may be made of a metal material containing copper. In this way, compared with the case where the second wire is made of a metal material containing aluminum, for example, the wire resistance of the second wire can be made relatively small. When the second wire is made of a metal material containing copper, during the patterning of the second wire on the upper side of the first wire, adhesive property with the resist provided on the upper side of the second wire may be adversely affected. In that case, the etchant may readily infiltrate via a gap between the resist and the second wire, possibly causing disconnection in the second wire. In this respect, by providing the crank portion at the side edge of the intersecting portion of the first wire intersecting with the second wire, the etchant infiltration path can be increased in length. Thus, the disconnection of the second wire can be effectively prevented.

(16) The crank portion may include an overlapping portion overlapping with the second wire and a non-overlapping portion not overlapping with the second wire. In this way, even if, during the patterning of the second wire, the second wire is displaced from a normal position with respect to the first wire extending direction, the crank portion can reliably overlap with the second wire as long as the displacement amount is in a range that does not exceed the non-overlapping portion. Thus, the function of the crank portion can be more reliably exploited.

(17) A middle position of the crank portion in a first wire extending direction in which the first wire extends may overlap with a side edge of the second wire. In this way, the distances from the side edges of the crank portion to the side edge of the second wire can be made equal to each other. Thus, when the positional relationship of the first wire and the second wire with respect to the first wire extending direction is inspected after the first wire and the second wire have been patterned, for example, the distances between the side edges of the crank portion and the side edge of the second wire can be used as an inspection index.

(18) The crank portion may be arranged at substantially a center of the second wire in a width direction. In this way, the distances from the side edges of the second wire to the crank portion can be made substantially equal. Thus, when the positional relationship between the first wire and the second wire with respect to the first wire extending direction is inspected after the first wire and the second wire have been patterned, for example, the distances between the side edges of the second wire and the crank portion can be used as an inspection index.

(19) The display device may further include a display panel including the display area and the non-display area; and a backlight unit that supplies light toward the display panel. In this way, an image can be displayed in the display area of the display panel by utilizing light supplied from the lighting device. Thus, the brightness of the displayed image can be increased. The display panel may be a liquid crystal panel. The display device as a liquid crystal display device may be applied to various purposes, including displays for televisions and personal computers, and is particularly suitable for large screens.

Advantageous Effect of the Invention

According to the present invention, disconnection in the non-display area can be prevented.

BRIEF DESCRIPTION OF THE DRAWINGS

FIG. 1 is an exploded perspective view illustrating a schematic configuration of a television device according to the first embodiment of the present invention.

BEST MODE FOR CARRYING OUT THE INVENTION

First Embodiment

The first embodiment of the present invention will be described with reference to FIGS. 1 to 14. According to the present embodiment, a liquid crystal display device 10 provided with a liquid crystal panel 11 will be described. The upper side and the lower side shown in FIG. 3 correspond to the front side and the rear side, respectively.

Figure 2:
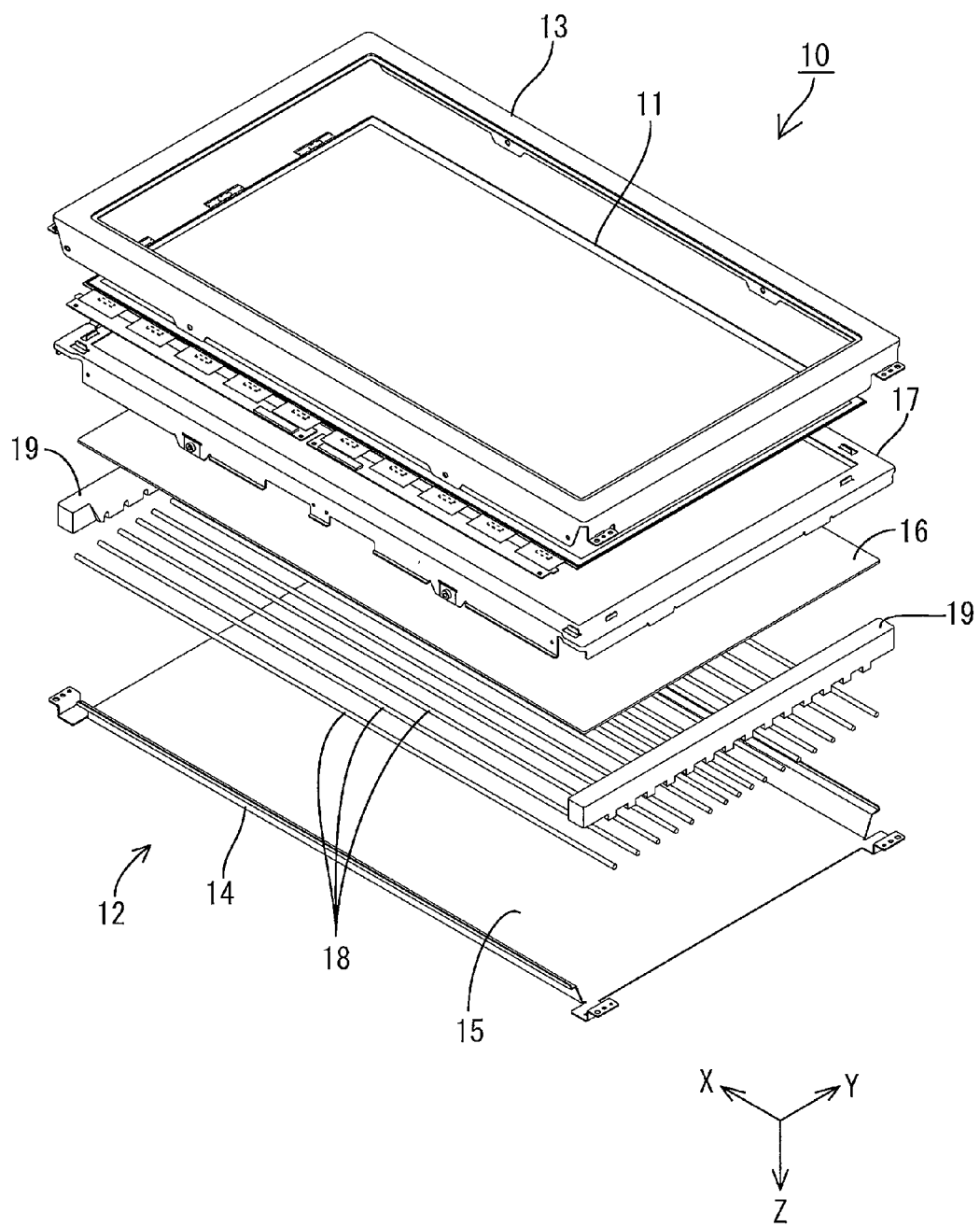
FIG. 2 is an exploded perspective view illustrating a schematic configuration of a liquid crystal display device included in the television device.
Figure 3:
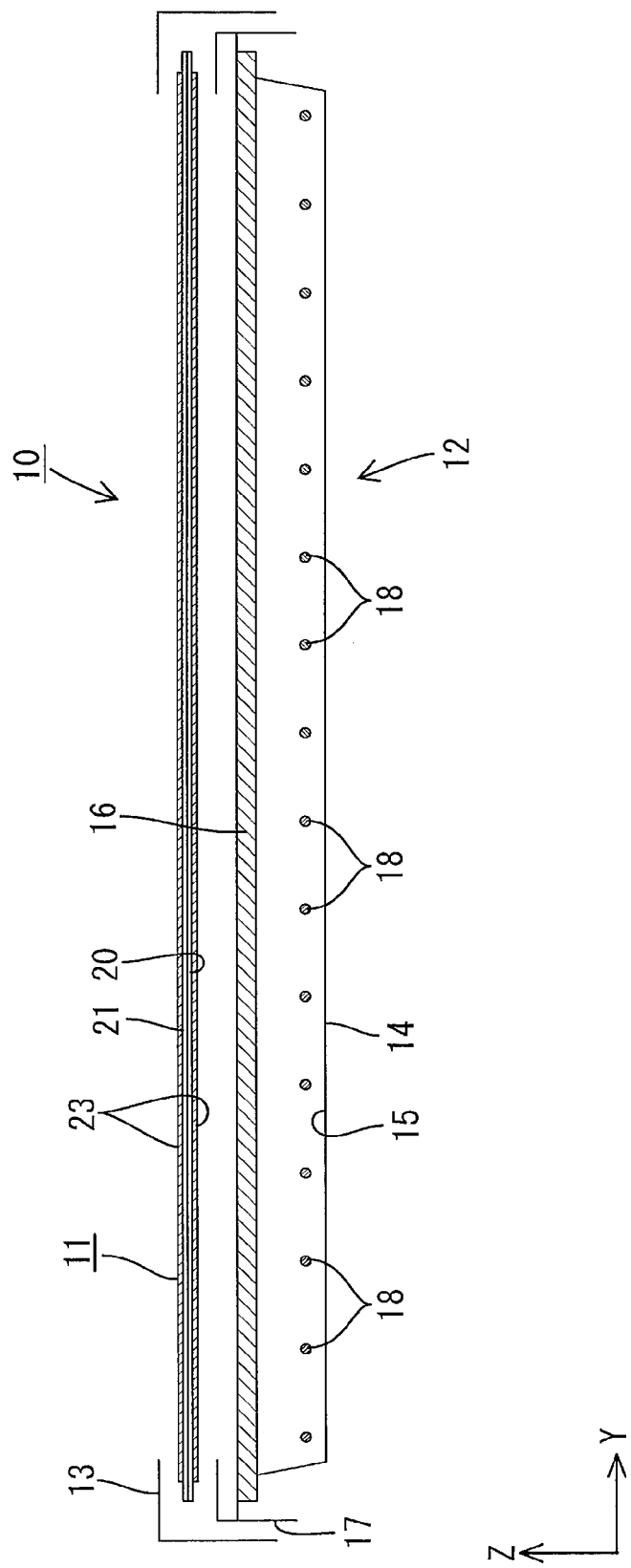
FIG. 3 is a cross sectional view schematically illustrating a cross sectional configuration of the liquid crystal display device.

As illustrated in FIG. 1, a television device TV according to the present embodiment includes the liquid crystal display device 10 (display device), front and rear cabinets Ca and Cb between which the liquid crystal display device 10 is housed, a power source P, a tuner T, and a stand S. The liquid crystal display device 10 has a horizontally long square shape as a whole. As depicted in FIGS. 2 and 3, the liquid crystal display device 10 is provided with a liquid crystal panel 11, which is a display panel with a rectangular planar shape, and with a backlight unit 12 (lighting device), which is an external light source. The liquid crystal panel 11, the backlight unit 12 and the like are integrally held by a bezel 13 and the like.

First, a configuration of the backlight unit 12 will be schematically described. The backlight unit 12 is a so-called direct backlight in which a light source is disposed immediately under the back side of liquid crystal panel 11. The backlight unit 12 includes a chassis 14 with an opening on a front side (light output side, facing the liquid crystal panel 11); a reflection sheet 15 laid in the chassis 14; an optical member 16 attached in the opening portion of the chassis 14; a frame 17 for fixing the optical member 16; a plurality of cold cathode tubes 18 (light sources) housed in the chassis 14 side by side with one another; and a lamp holder 19 that blocks light from the end portions of the cold cathode tubes 18 and that is provided with its own optical reflectivity.

Figure 4:
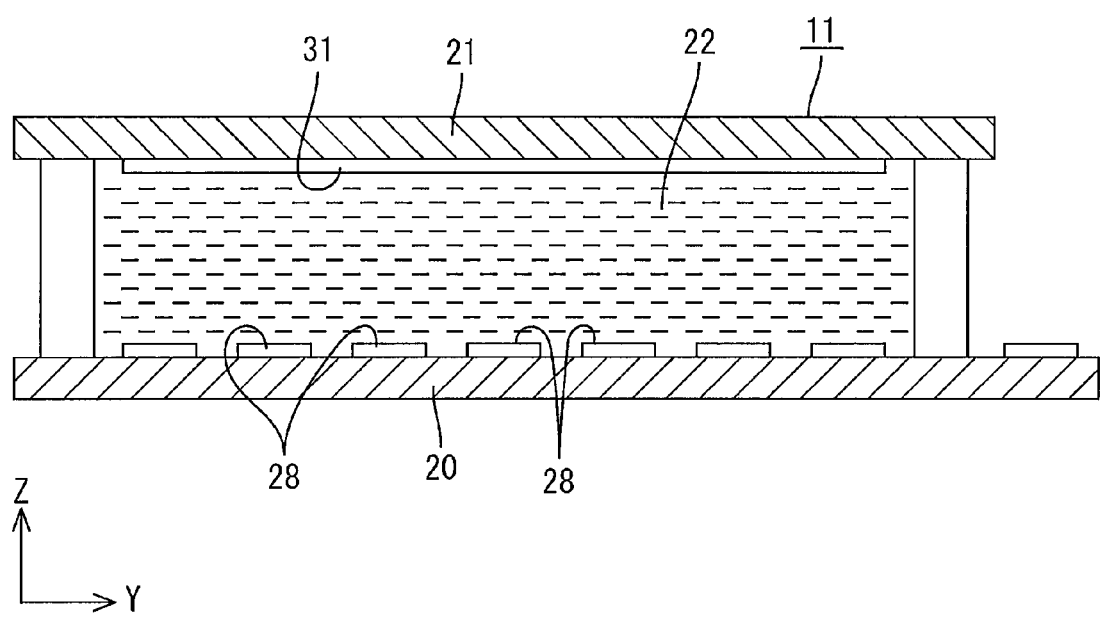
FIG. 4 is a view schematically illustrating a cross sectional configuration of a liquid crystal panel.

Next, the liquid crystal panel 11 will be described. As depicted in FIG. 4, the liquid crystal panel 11 includes a pair of transparent (light transmissive) glass substrates 20 and 21 between which a liquid crystal layer 22 containing a liquid crystal material, which is a substance whose optical characteristics are changed by application of an electric field, is hermetically sealed. One of the substrates 20 and 21 of the liquid crystal panel 11 that is disposed on the rear side (facing the backlight unit 12) provides an array substrate (element substrate) 20, and the other disposed on the front side (light output side of the element board 20) provides a CF substrate (counter substrate) 21. On the inner surface sides of the substrates 20 and 21, orientation films (not depicted) for orienting the liquid crystal molecules contained in the liquid crystal layer 22 are formed facing the liquid crystal layer 22. On the outer surface sides of the substrates 20 and 21, a pair of front and rear polarizing plates 23 is affixed respectively (see FIG. 3).

Figure 5:
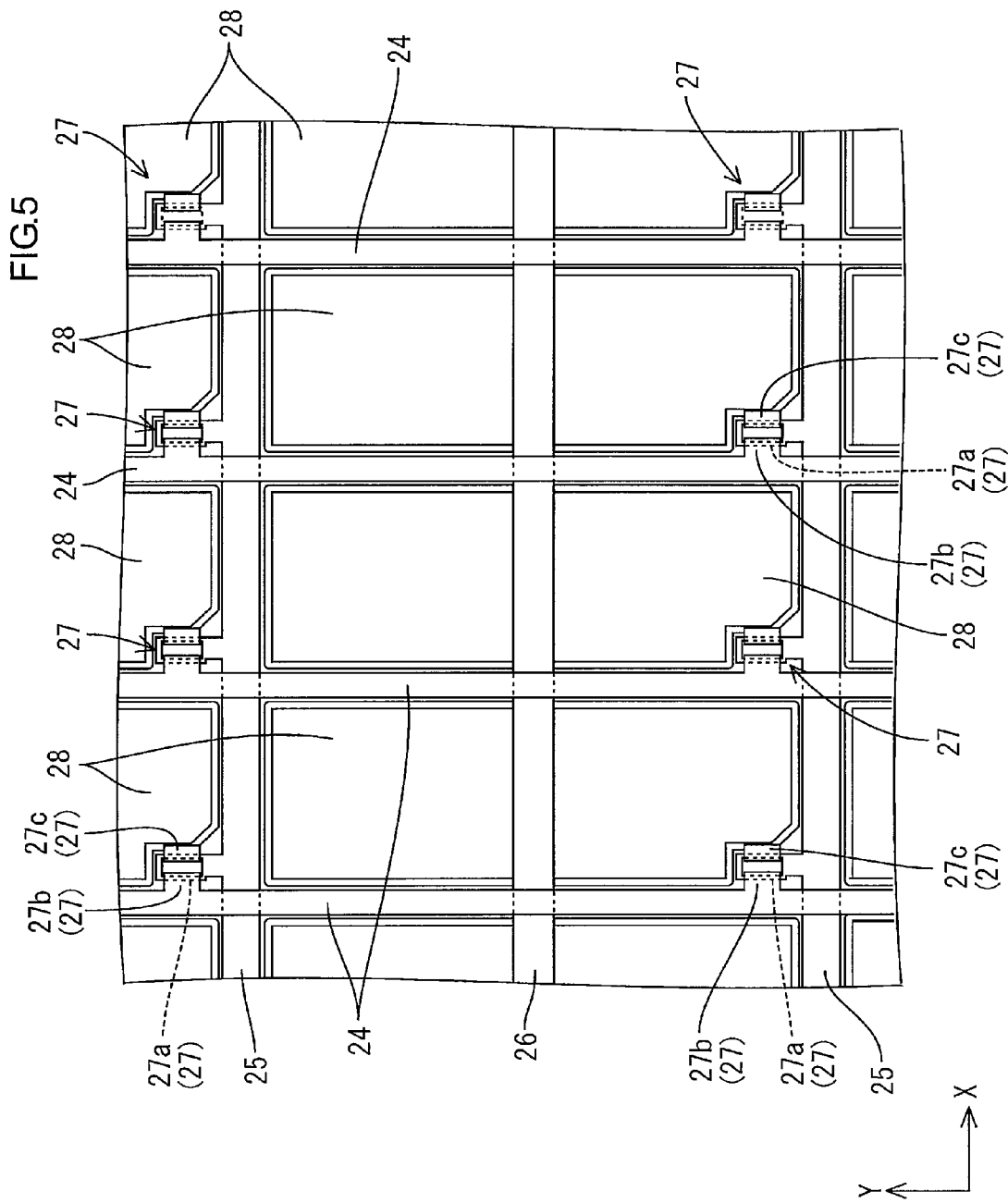
FIG. 5 is a planar view illustrating a planar configuration of a display area of an array substrate of the liquid crystal panel.
Figure 6:
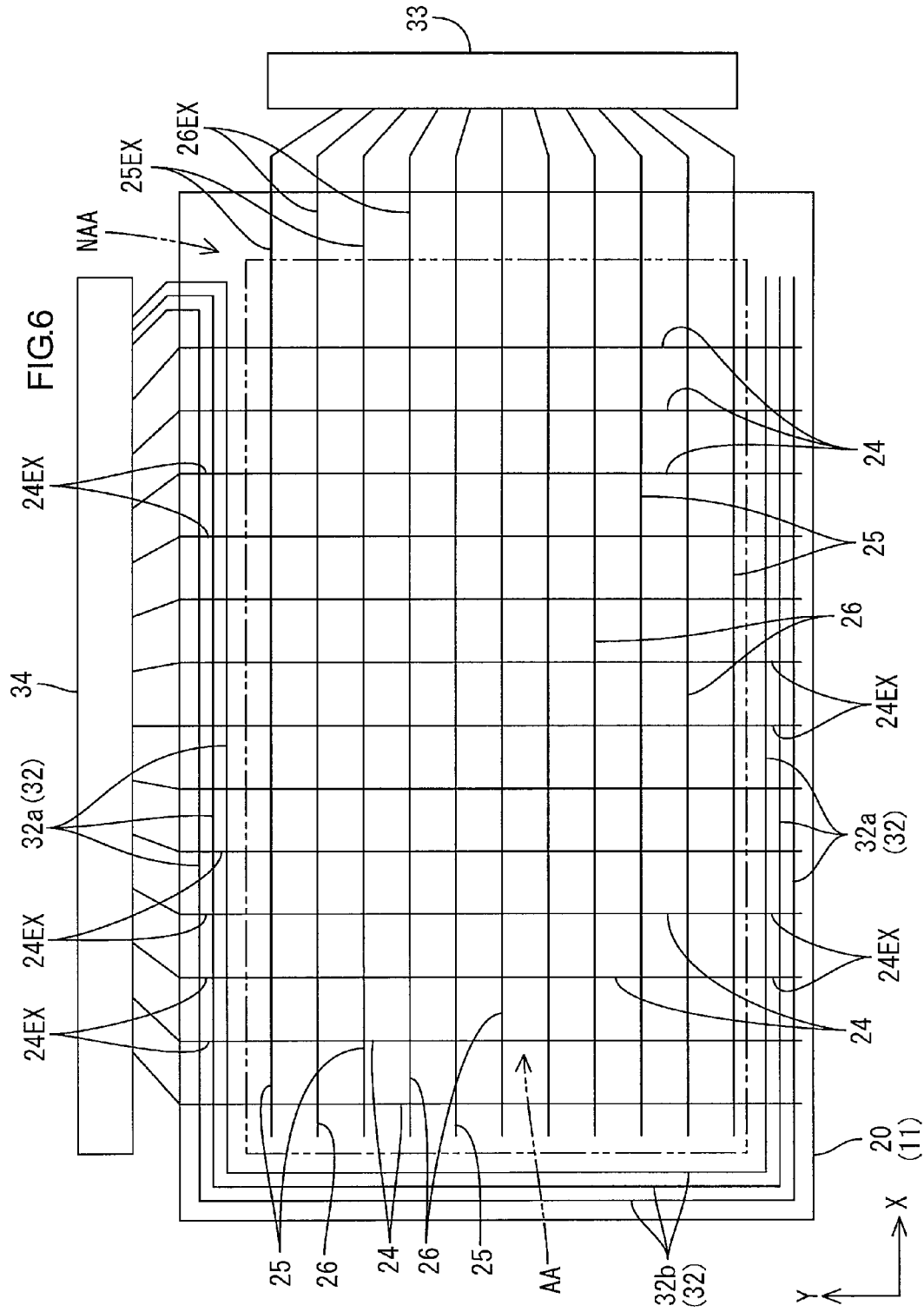
FIG. 6 is a planar view schematically illustrating a wiring configuration of the liquid crystal panel.

As depicted in FIG. 6, the liquid crystal panel 11 includes a display area AA (area surrounded by a two-dot chain line in FIG. 6) in which an image is displayed, and a frame-shaped non-display area NAA surrounding the display area AA in which no image is displayed. A configuration of the display area AA of the array substrate 20 will be described. As depicted in FIG. 5, on the inner surface side of the array substrate 20 (facing the liquid crystal layer 22; the opposite side to the CF substrate 21), there are formed in a lattice arrangement, a plurality of source wires (signal wires) 24 extending side by side with each other along the Y-axis direction (column direction, vertical direction); a plurality of gate wires (scan wires) 25 extending side by side with each other along an X-axis direction (row direction, horizontal direction), i.e., along a direction orthogonal to (intersecting with) the source wires 24; and a plurality of storage capacitor wires (auxiliary capacity wires, Cs wires) 26 disposed side by side with each other between and parallel with the gate wires 25. The gate wires 25 and the storage capacitor wires 26 are alternately disposed with the intervals between adjacent wires 25 and 26 set to be substantially equal.

The gate wires 25 and the storage capacitor wires 26 are provided from the same material in the same process during the manufacturing process for the array substrate 20, and disposed in the same layer (order of stacking). The gate wires 25 and the storage capacitor wires 26 are disposed on a lower side with respect to the source wires 24. The source wires 24 are disposed on an upper side with respect to the gate wires 25 and the storage capacitor wires 26 (see FIGS. 8 and 9). Between the source wires 24 and each of the intersecting gate wires 25 and storage capacitor wires 26, a gate insulating film (insulating layer) 29 is disposed, whereby an insulated state is maintained therebetween. On an upper side of the source wires 24 disposed on the relatively upper side, an interlayer insulating film (passivation film, protection layer) 30 is provided. The interlayer insulating film 30 protects the source wires 24. The gate wires 25, the source wires 24, and the storage capacitor wires 26 are made of a metal material including copper (Cu), specifically an alloy of copper and titanium (Ti), for example.

As depicted in FIG. 5, the source wires 24 and the gate wires 25 intersect with each other, and at the intersecting portion thereof, a TFT 27 (Thin Film Transistor) is formed as a switching component connected to the wires 24 and 25. The TFT 27 is of a so-called inverted staggered type and is disposed over the gate wire 25, with a part of the gate wire 25 forming a gate electrode 27a. To the gate electrode 27a, a scan signal which is inputted to the gate wire 25 at a predetermined timing is supplied. A branch line drawn from the source wire 24 toward the TFT 27 forms a source electrode 27b for the TFT 27 that overlaps with the gate electrode 27a via a semiconductor film (not depicted) and the like. To the source electrode 27b, an image signal (data signal) to be inputted to the source wires 24 is supplied.

In each of areas surrounded by the source wires 24, the gate wires 25, and the storage capacitor wires 26, a vertically long square shaped pixel electrode 28 is disposed, and thus, as depicted in FIG. 5, a plurality of pixel electrodes 28 are arranged in a matrix. To the pixel electrode 28, a drain wire is connected via a contact hole (both the contact hole and the drain wire are not depicted). One end of the drain wire is drawn out toward the TFT 27 to form a drain electrode 27c overlapping with the gate electrode 27a via the semiconductor film and the like (not depicted). While the pixel electrode 28 is disposed on an upper side of the interlayer insulating film 30, the drain wire is formed in the same layer, from the same material, and in the same process as for the source wires 24. A substantially central portion of the pixel electrode 28 in the long side direction thereof is disposed overlapping with each of the storage capacitor wires 26 via the gate insulating film 29 and the interlayer insulating film 30, whereby a capacitance is formed between the pixel electrode 28 and each of the storage capacitor wires 26. Thus, even in a period (TFT-off period) in which a scan signal is not inputted to the gate electrode 27a of the TFT 27, the voltage of the pixel electrode 28 can be held. The pixel electrode 28 is made of a transparent conductive film of ITO (indium tin oxide) or ZnO (zinc oxide), for example.

A configuration in the display area AA of the CF substrate 21 will be described. On an inner surface side (facing the liquid crystal layer 22; opposite side to the array substrate 20) of the CF substrate 21, a color filter including colored portions exhibiting R (red), G (green), and B (blue) is provided (not depicted). Each of the colored portions is disposed at a position overlapping with the pixel electrode 28 on the array substrate 20 side in a plan view, that is, a plurality of the color portions are arranged in a matrix. Between the colored portions of the color filter, a lattice shaped light blocking portion (black matrix) for preventing the mixing of colors is formed (not depicted). The light blocking portion is disposed overlapping with the source wires 24, the gate wires 25, and the storage capacitor wires 26 on the array substrate 20 side in a plan view. As depicted in FIG. 4, on the surfaces of the colored portions and the light blocking portion, a counter electrode 31 is disposed facing the pixel electrode 28 on the array substrate 20 side.

A configuration in the non-display area NAA of the array substrate 20 will be described. As depicted in FIG. 6, the non-display area NAA of the array substrate 20 includes extension portions 25EX and extension portions 26EX respectively extending from the gate wires 25 and the storage capacitor wires 26 on the display area AA, on the inner surface side of the end portion on one of the short sides thereof (the right side end portion depicted in FIG. 6). The extension ends of the extension portions 25EX and 26EX are fitted with terminal portions. The terminal portions are connected to one end of a supply gate driver 33 is connected. The supply gate driver 33 supplies the gate wires 25 with a scan signal and the like, and supplies the storage capacitor wires 26 with a reference potential and the like. To the other end of the gate driver 33, a control substrate (not depicted) is connected as a source of signals and the like.

Meanwhile, as depicted in FIG. 6, the non-display area NAA of the array substrate 20 includes extension portions 24EX extending from the source wires (the second wires) 24 on the display area AA side and a plurality of backup wires (the first wires) 32, on the inner surface side of portions of the gate wires 25 and the storage capacitor wires 26 without the extension portions 25EX and 26EX. The backup wires 32 intersect with the extension portions 24EX and are configured to repair the source wires 24 when the source wires 24 are disconnected. Specifically, the source wires 24 extend along the full length of the display area AA in the short side direction thereof (Y-axis direction), with the end portions of the source wires 24 extending toward both end portions of the non-display area NAA on the long sides thereof (upper and lower end portions in FIG. 6). Thus, a pair of extension portions 24EX is disposed on the end portions of the non-display area NAA of the array substrate 20 on the long sides thereof. The backup wires 32 are disposed along the three sides of the non-display area NAA; namely, two in the end portions on the long sides of the non-display area NAA, and one of the end portions of the non-display area NAA on the short sides that is opposite to the gate driver 33 side (with the extension portions 25EX and 26EX). Thus, the backup wires 32 are disposed surrounding the display area AA from three sides. The end portion of the non-display area NAA of the array substrate 20 on one of the long sides (the upper end portion depicted in FIG. 6) is provided with terminal portions fitted to the end portions of the extension portions 24EX of the source wires 24 and the backup wires 32. The terminal portions are connected to one end of a source driver 34, which supplies scan signals and the like to the source wires 24 and the backup wires 32. To the other end of the source driver 34, a control substrate as a source of signals and the like is connected.

Figure 8:
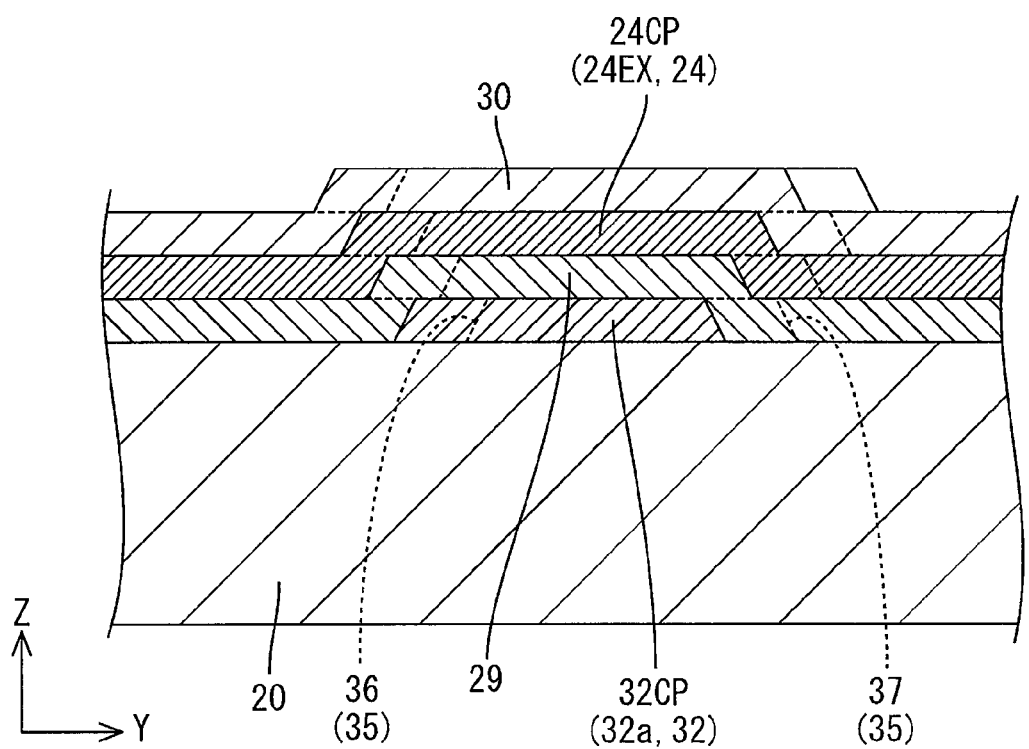
FIG. 8 is a cross sectional view taken along line viii-viii of FIG. 7.
Figure 9:
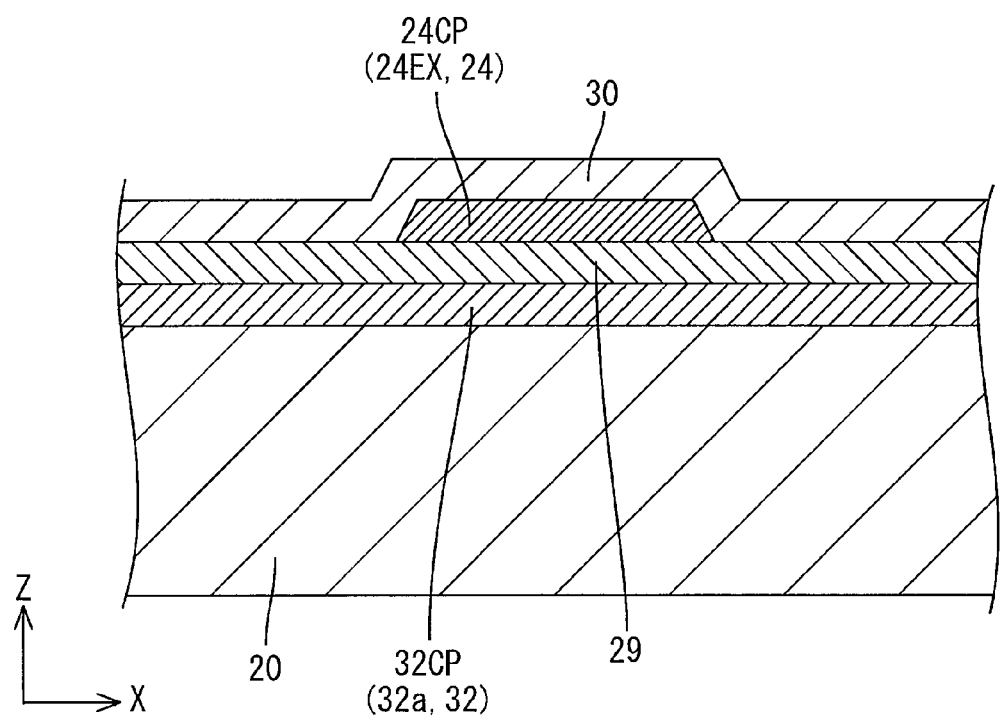
FIG. 9 is a cross sectional view taken along line ix-ix of FIG. 7.

As depicted in FIG. 6, the backup wires 32 include a pair of long side portions 32a extending along the long side direction of the array substrate 20 (X-axis direction), and a short side portion 32b extending along the short side direction of the array substrate 20 (Y-axis direction). The pair of long side portions 32a intersects with and traverses pairs of extension portions 24EX of all of the source wires 24. The backup wires 32 are provided in the same process and from the same material (the metal material including copper as described) in the manufacturing process for the array substrate 20, and disposed in the same layer (order of stacking) as for the gate wires 25 and the auxiliary capacity wires 26. Thus, as depicted in FIGS. 8 and 9, the backup wires 32 are disposed on a lower side with respect to the extension portions 24EX of the source wires 24, and the extension portions 24EX of the source wires 24 are disposed on an upper side with respect to the backup wires 32. Between the extension portions 24EX of the source wires 24 and the long side portions 32a of the backup wires 32 which intersect with one another, the gate insulating film 29 is disposed, whereby the extension portions 24EX and the long side portions 32a are insulated from each other. On an upper side of the extension portions 24EX of the source wires 24 disposed on the upper side, the interlayer insulating film 30 is disposed. The interlayer insulating film 30 protects the extension portions 24EX of the source wires 24.

Figure 10:
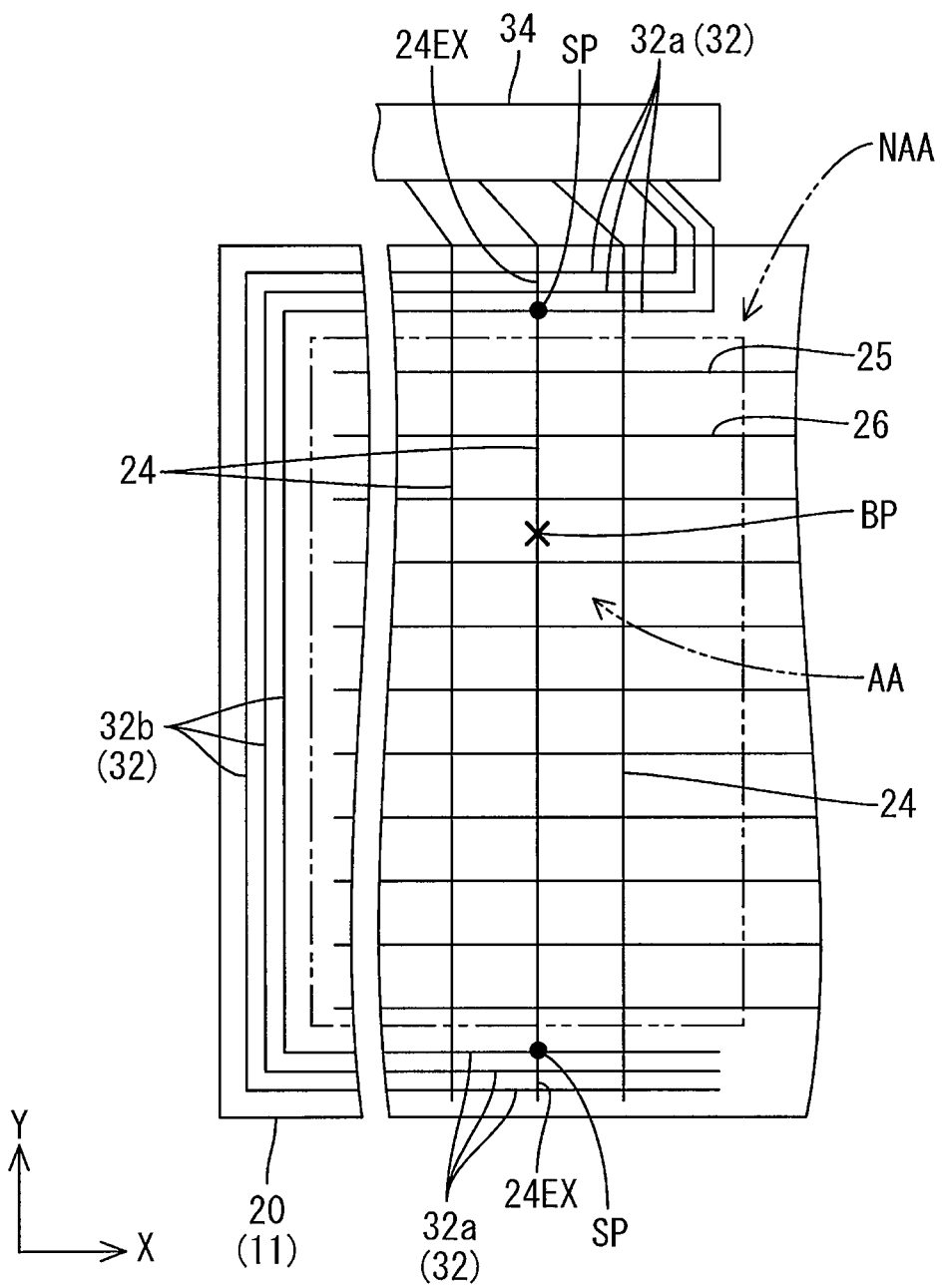
FIG. 10 is a planar view illustrating a method for repairing a disconnected source wire with a backup wire.

The function of the backup wires 32 will be described in detail. As depicted in FIG. 10, when a disconnection is caused in a certain source wire 24, portion of the backup wires 32 that intersect with the pair of extension portions 24EX of the source wire 24 with a disconnection point BP are irradiated with laser light, for example, causing electrical short-circuit to the extension portions 24EX. Thus, the source wire 24 with the disconnection point BP is supplied with an image signal and the like from the source driver 34 via the backup wire 32 that has been short-circuited at the pair of short-circuited points SP as a detour.

The wires 24 to 26 and 32 provided to the array substrate 20 are formed by patterning a film of a metal material into a predetermined pattern shape using photolithography well known in the art. Among others, when the source wires 24 to be disposed on the upper side are patterned, the following problem may be caused. Namely, when the source wires 24 are patterned, a photosensitive resist film R is formed on the upper side of the metal film forming the source wires 24 (see FIGS. 11 and 12). After the resist film R is exposed and developed (see FIG. 13), wet etching is performed by using a predetermined etchant (see FIG. 14). Then, the etchant may possibly infiltrate even the portions of the source wires 24 that are covered with the resist film R. This is due to the following reasons. The source wires 24 include overlying portions at which the source wires 24 intersect with the gate wires 24 and the storage capacitor wires 26 in the display area AA. In the overlying portions, adhesive property with respect to the resist film R may be lowered. In addition, because the metal material forming the source wires 24 contains copper, adhesive property with respect to the resist film R is decreased compared with a metal material containing aluminum, for example. As a result, a gap may be provided between the source wires 24 and the resist film R, and the etchant may infiltrate the gap. Because the gap, i.e., an etchant infiltration path, extends along the side edges of the gate wires 24 and the storage capacitor wires 26 on the lower side while traversing the source wires 24. Thus, if the etchant infiltrates along the entire width of the source wire 24, the source wire 24 may be disconnected.

The disconnection of the source wires 24 may be similarly caused at an intersecting portion 24CP of the extension portions 24EX of the source wires 24 that intersect with the long side portions 32a of the backup wires 32 in the non-display area NAA. An analysis of the present inventor has indicated that in this case, a greater problem may be caused. First, of a pair of extension portions 24EX of the source wires 24, when a disconnection is caused in the extension portion 24EX on the side closer to the source driver 34 (terminal portions) as a source of various signals (upper side in FIG. 6), it becomes impossible to supply signals to all of the TFTs 27 connected to the source wire 24 having the disconnected extension portion 24EX. While in this case a repair by the backup wire 32 may be considered, the repair may become impossible depending on the location of the disconnection. As a result, a line defect may be caused in the associated source wire 24, and display quality may be significantly degraded. Further, there have been demands in recent years for narrowing the frame of the liquid crystal display device 10 for design reasons. If the width of the non-display area NAA, i.e., the frame portion surrounding the display area AA, is narrowed, the line width of the backup wires 32 extending along the frames would also have to be made narrower. When the line width of the backup wires 32 is narrowed, the flat portion of the extension portions 24EX of the source wires 24 that overlies the backup wires 32 becomes shorter, with the forward and backward bent points of the overlying flat portion brought closer to each other (see FIG. 8), thereby further degrading the adhesive property with the resist film. R. Thus, narrowing the frame tends to lead to disconnection of the source wires 24.

Figure 7:
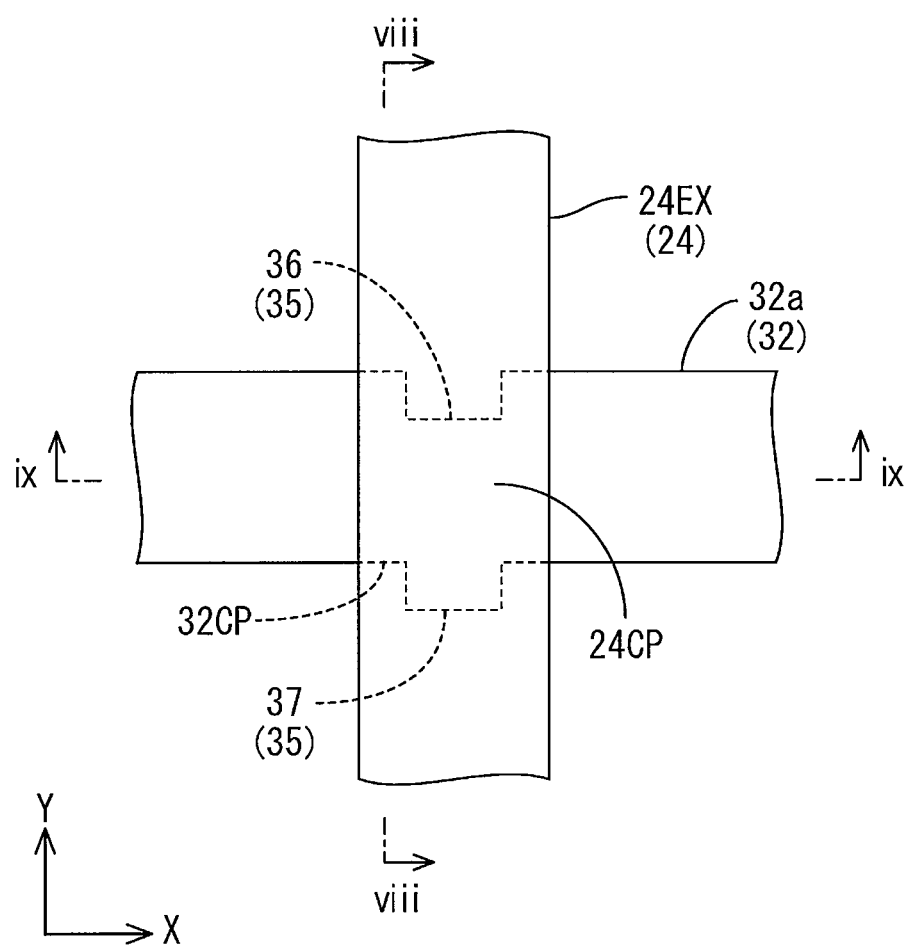
FIG. 7 is a planar view illustrating a planar configuration of intersecting portions of an extension portion of the source wire and a backup wire in a non-display area.

According to the present embodiment, in the non-display area NAA, as depicted in FIG. 7, crank portions 35 which are bent in the direction in which the source wires 24 extend, i.e., the Y-axis direction, are provided on the side edges of the intersecting portion 32CP of the long side portions 32a of the backup wires 32 intersecting with the extension portions 24EX of the source wires 24. The crank portions 35 are respectively provided at both of the side edges of the intersecting portion 32CP of the long side portions 32a of the backup wires 32, and include a recess 36 provided at one of the side edges and recessed in the Y-axis direction, and a protrusion 37 provided at the other side edge and protruding in the Y-axis direction. The recess 36 and the protrusion 37 both have a horizontally long square shape in a plan view, with the long side direction corresponding to the X-axis direction, i.e., the direction in which the long side portions 32a of the backup wires 32 extend, and the short side direction corresponding to the Y-axis direction, i.e., the direction in which the source wires 24 extend. In this way, at one of the side edges of the intersecting portion 32CP, the etchant infiltration path can be increased in length by the recessed amount of the recess 36; specifically, by the measurements of the pair of the short sides of the recess 36, compared to the conventional configuration. Similarly, at the other side edge, the etchant infiltration path can be increased in length by the protruding amount of the protrusion 37; specifically, by the measurements of the pair of the short sides of the protrusion 37, compared to the conventional configuration. Thus, it becomes more difficult for the extension portions 24EX of the source wires 24 to be etched along the entire width thereof by the etchant, leading to a difficulty for disconnection to occur in the source wires 24 in the non-display area NAA.

Specifically, as depicted in FIG. 7, the recess 36 is formed by recessing the side edge of the intersecting portion 32CP of the backup wires 32 on the upper side in FIG. 7 downward in the same FIG. 7 by a recessed amount (short side measurement) of not more than a half (such as ¼) the line width of the backup wires 32. The protrusion 37 is formed by protruding the side edge of the intersecting portion 32CP of the backup wires 32 on the lower side in FIG. 7 downward in the same FIG. 7 by a protruding amount (short side measurement) of not more than a half (such as ¼) the line width of the backup wires 32. The protruding amount is substantially the same as the recessed amount of the recess 36. The long side measurement of the recess 36 is smaller than the line width of the source wires 24. For example, the long side measurement of the recess 36 is one half the line width of the source wires 24. The long side measurement of the protrusion 37 is substantially the same as the long side measurement of the recess 36. Thus, the recess 36 and the protrusion 37 have substantially the same area when observed in a plan view. Accordingly, the parasitic capacity formed between the intersecting portion 24CP of the extension portions 24EX of the source wires 24 and the intersecting portion 32CP of the long side portions 32a of the backup wires 32 is substantially the same as in the case where the recess 36 and the protrusion 37 are absent, and is hardly changed therefrom.

As depicted in FIG. 7, the recess 36 and the protrusion 37 are disposed with their center positions with respect to the long side direction thereof substantially aligned with each other. Thus, the recess 36 and the protrusion 37 overlap with each other throughout their lengths in the long side direction, and have no un-overlapping portions with respect to their length in the long-side direction. In other words, the recess 36 and the protrusion 37 are disposed back to back with each other. Because the recess 36 and the protrusion 37 have substantially the same short side measurement and substantially the same long side measurement as described above, the long side portions 32a of the backup wires 32 have the same line width between the portions where the crank portions 35 (the recess 36 and the protrusion 37) are formed and not formed. Thus, the long side portions 32a have a uniform line width throughout the lengths thereof. The recess 36 and the protrusion 37 are disposed with their center positions with respect to the long side direction substantially aligned with the center position of the extension portions 24EX of the source wires 24 in the width direction thereof. Thus, the distances between the side edges of the extension portions 24EX of the source wires 24 and the short sides of the recess 36 and the protrusion 37 are substantially the same. Further, the recess 36 and the protrusion 37 entirely overlap with the extension portions 24EX of the source wires 24 in a plan view.

An operation of the present embodiment with the above-described structure will be described. Here, a process of manufacturing the array substrate 20 of the liquid crystal panel 11 will be described in detail.

On the surface of the array substrate 20, the components are successively stacked by photolithography as well known in the art. Specifically, the gate wires 25, the storage capacitor wires 26, and the backup wires 32 are formed on the surface of the array substrate 20, as a first layer. Then, the gate insulating film 29 as a second layer, the source wires 24 and the drain wires as a third layer, the interlayer insulating film 30 as a fourth layer, the pixel electrodes 28 as a fifth layer, and the orientation films as a sixth layer are successively formed (see FIGS. 8 and 9, for example). The long side portions 32a of the backup wires 32 include the crank portions 35, i.e., the recess 36 and the protrusion 37. The recess 36 and the protrusion 37 have substantially the same short side measurement and substantially the same long side measurement, and are disposed overlapping with each other in the X-axis direction throughout their lengths. Thus, the long side portions 32a of the backup wires 32 have a constant line width throughout their lengths, which does not vary anywhere along the lengths (see FIG. 7). Accordingly, a pattern defect and the like are made difficult to occur during the patterning of the backup wires 32. As depicted in FIG. 7, the intersecting portion 32CP of the long side portions 32a of the backup wires 32 intersecting with the extension portions 24EX of the source wires 24 includes the recess 36 and the protrusion 37, i.e., the crank portions 35. Thus, as depicted in FIG. 8, the gate insulating film 29, the intersecting portion 24CP of the source wires 24, and the interlayer insulating film 30, which are stacked on the upper side of the intersecting portion 32CP, have overlying portions that are bent along the recess 36 and the protrusion 37 in a plan view.

Figure 11:
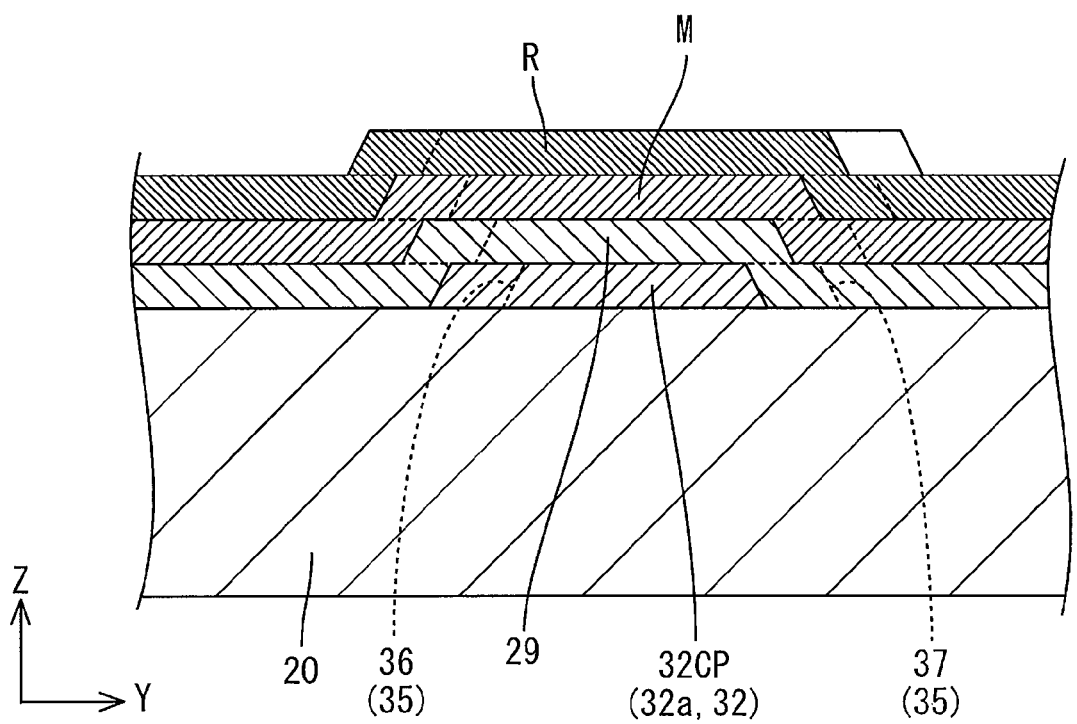
FIG. 11 is a cross sectional view taken along line viii-viii of FIG. 7, illustrating a state in which a resist film is stacked on a metal film forming the source wire in an array substrate manufacturing process.
Figure 12:
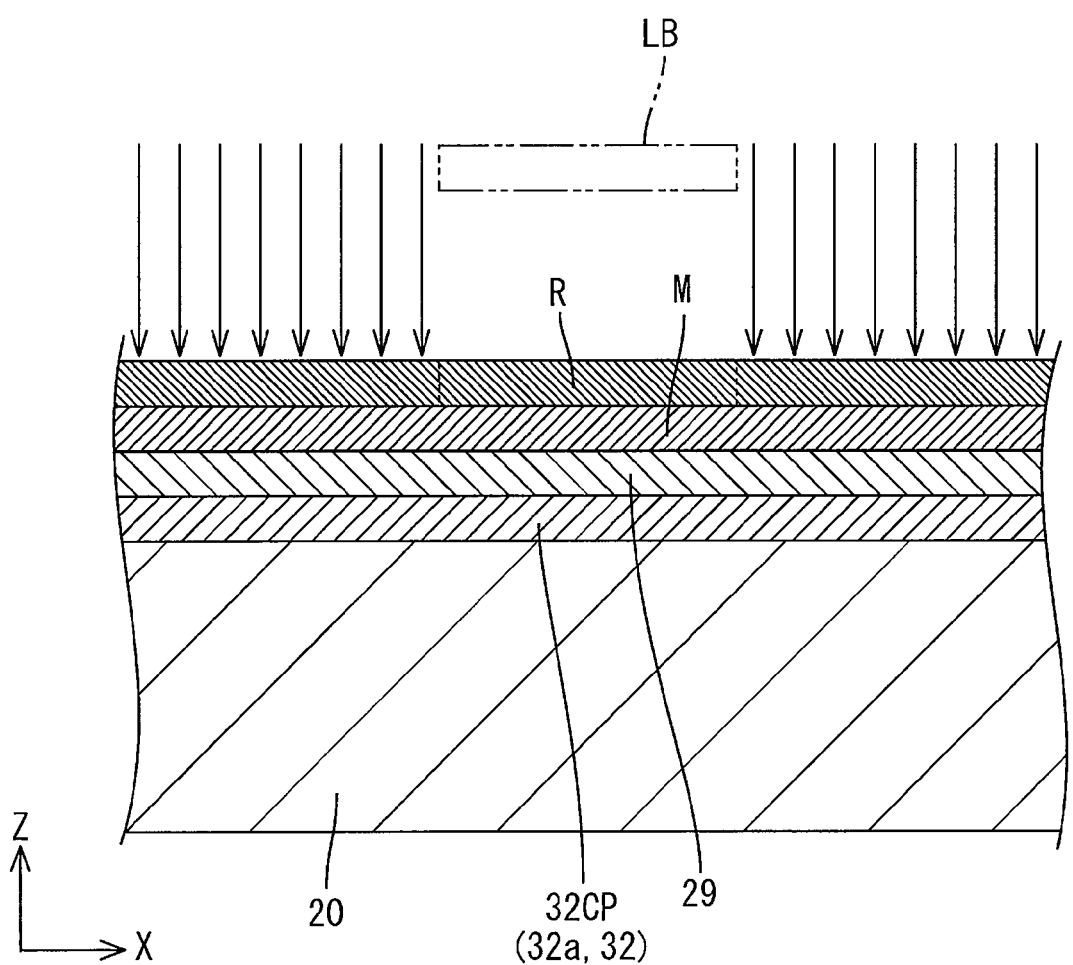
FIG. 12 is a cross sectional view taken along line ix-ix of FIG. 7, illustrating a state in which the resist film is stacked on the metal film forming the source wire in an array substrate manufacturing process.
Figure 13:
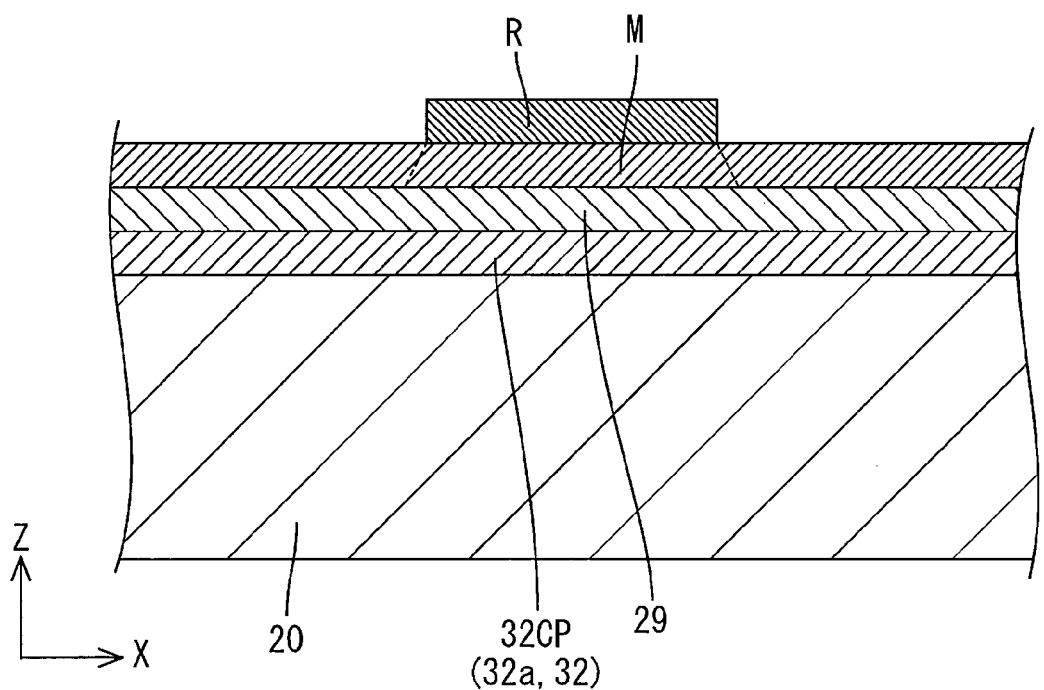
FIG. 13 is a cross sectional view taken along line ix-ix of FIG. 7, illustrating a state in which an expose resist film has been developed in the array substrate manufacturing process.
Figure 14:
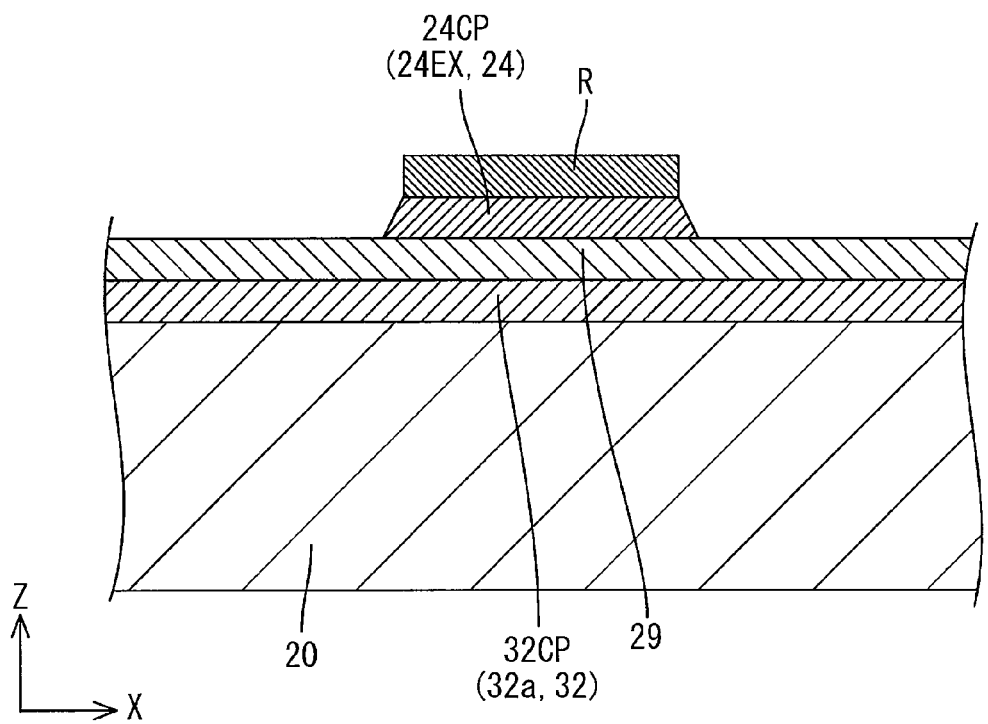
FIG. 14 is a cross sectional view taken along line ix-ix of FIG. 7, illustrating a state in which a metal film forming the source wire has been etched in the array substrate manufacturing process.

A process of patterning the source wires 24 will be described in detail. On the upper side of the gate insulating film 29, a metal film M of a metal material forming the source wires 24 is formed to a uniform film thickness (source film forming process). Then, as depicted in FIGS. 11 and 12, on the upper side of the metal film forming the source wires 24, a photosensitive resist film R is formed to a uniform film thickness (resist film forming process). The resist film R is of the so-called positive type such that the exposed portion has an increased solubility with respect to a developing solution and can be removed by the developing solution. After the resist film R is formed, a process for exposing the resist film R by using a mask with a pattern corresponding to the source wires 24 is performed (exposing process). In FIG. 12, a light blocking portion LB of the mask is indicated by a two-dot chain line, and the light to which the resist film R is exposed is indicated by arrows. After the resist film R is exposed to the light, the resist film R is developed by using a developing solution (developing process). Then, as depicted in FIG. 13, the exposed portions of the resist film R are removed while the non-exposed portion remains. Thereafter, wet etching of the metal film M forming the source wires 24 is performed by using a predetermined etchant (etching process). As a result of the wet etching, as depicted in FIG. 14, the exposed portions of the metal film M forming the source wires 24 that have not been covered by the resist film R (where the resist film R has not been formed) are removed by etching as the etchant infiltrates therein, while the portions covered by the resist film R (where the resist film R has been formed) remains because the etchant does not infiltrate therein.

Because the metal film M forming the source wires 24 is made of a metal material containing copper, the metal film M does not essentially have favorable adhesive property with respect to the resist film R. In addition, the metal film M has the overlying portions (stepped portion) that overlie the backup wires 32 in the non-display area NAA. Thus, the adhesive property of the metal film M with respect to the resist film R in the overlying portions tends to deteriorate. Further, when the line width of the backup wires 32 is narrowed in an attempt to make the frame of the liquid crystal display device 10 narrower, the flat portion of the metal film M forming the source wires 24 that overlies the backup wires 32 becomes shorter such that the forward and backward bent points of the flat portion are brought closer to each other. As a result, the adhesive property with respect to the resist film R may be further degraded (see FIG. 8). When the adhesive property between metal film M forming the source wires 24 and the resist film R is degraded, a gap may be provided between the metal film M and the resist film R. The gap, i.e., an etchant infiltration path, extends along the side edges of the long side portions 32a of the backup wires 32 on the lower side that overlap with the bent points in a plan view.

In this respect, according to the present embodiment, the recess 36 and the protrusion 37, which are the crank portions 35, are respectively provided at the side edges of the intersecting portion 32CP of the long side portions 32a of the backup wires 32 intersecting with the extension portions 24EX of the source wires 24. Thus, the side edges have a meandering shape (non-linear shape, bent shape) that causes the etchant infiltration path to meander (bend). In addition, the etchant infiltration path can be increased in length by the measurements corresponding to the recessed amount of the recess 36 and the protruding amount of the protrusion 37, compared to the conventional configuration. Accordingly, the portions of the metal film M forming the source wires 24 that correspond to the extension portions 24EX are less likely to be etched throughout the entire width thereof, compared to the conventional configuration, leading to more difficulty for disconnection to occur in the extension portions 24EX of the source wires 24. Further, in the non-display area NAA, the recess 36 and the protrusion 37 as the crank portions 35 are also provided at the intersecting portion 32CP of the long side portions 32a of the backup wires 32 on the source driver 34 side (upper side in FIG. 6) from which various signals are supplied. Thus, disconnection of the extension portions 24EX of the source wires 24 on the signal supply source side can be prevented. Accordingly, a line defect in the source wires 24 can be prevented in a preferred manner, whereby high display quality can be ensured. Disconnection of the extension portions 24EX of the source wires 24 can be prevented in a preferred manner, which is extremely useful in making the frame of the liquid crystal display device 10 narrower.

As described above, the liquid crystal display device (display device) 10 according to the present embodiment is provided with the display area AA for displaying an image and the non-display area NAA surrounding the display area AA. At least in the non-display area NAA, the backup wires 32 as the first wires and the source wires 24 as the second wires are provided. The source wires 24 are disposed on the upper side with respect to the backup wires 32 and intersect with the backup wires 32. At the side edges of the intersecting portion 32CP of the backup wires 32 intersecting with the source wires 24, the crank portions 35 that are bent in the direction in which the source wires 24 extend are provided.

The intersecting portion 24CP of the source wires 24 as the second wires, which are disposed on the relatively upper side and intersect with the backup wires 32 as the first wires, overlies the backup wires 32. When the source wires 24a are patterned on the upper side of the backup wires 32, the etchant used for etching the source wires 24 may infiltrate the intersecting portion 24CP (overlying portion) of the source wires 24 from outside along the side edges of the backup wires 32. As a result, the intersecting portion 24CP may be etched along the entire width thereof, possibly resulting in disconnection of the source wires 24.

However, according to the present embodiment, the crank portions 35 bent in the direction in which the source wires 24 extend are provided at the side edges of the intersecting portion 32CP of the backup wires 32 intersecting with the source wires 24. Thus, the etchant infiltration path can be increased in length by the crank portions 35. Accordingly, the intersecting portion 24CP of the source wires 24 is not likely to be etched by the etchant along the entire width thereof, whereby disconnection in the source wires 24 is made difficult to occur.

The backup wires 32 and the source wires 24 are disposed in the non-display area NAA of the liquid crystal display device 10. In the source wires 24 directly or indirectly connected to wires in the display area AA, if disconnection occurs, a predetermined voltage may not be supplied to the wires in the display area AA, and thereby the display quality may be significantly degraded. However, disconnection of the source wires 24 is prevented by the above configuration, and as a result, the display quality can be effectively prevented from being adversely affected. The non-display area NAA in which the backup wires 32 and the source wires 24 are disposed have the frame shape surrounding the display area AA. Therefore, when it is desired to narrow the frame of the liquid crystal display device 10, the width of the non-display area NAA is also required to be narrowed, and as a result, the backup wires 32 and the source wires 24 are also desired to be made thinner, resulting in a greater likelihood of disconnection. However, according to the above configuration, disconnection of the source wires 24 is prevented, which is extremely useful in making the frame narrower.

The crank portions 35 include at least the recess 36 at the side edge of the backup wires 32 as the first wires, and the recess 36 is recessed in the direction in which the source wires 24 as the second wires extend. In this way, the parasitic capacity that may be formed between the backup wires 32 and the source wires 24 can be decreased.

The recessed amount of the recess 36 is not more than a half the line width of the backup wires 32 as the first wires. If the recessed amount of the recess is more than one half the line width of the backup wires 32, the wire resistance may become excessive. By making the recessed amount of the recess 36 not more than one half the line width of the backup wires 32, the wire resistance of the backup wires 32 can be maintained at a low level.

The crank portions 35 include at least the protrusion 37 at the side edge of the backup wires 32 as the first wires, and the protrusion 37 protrudes in the direction in which the source wires 24 as the second wires extend. In this way, the wire resistance of the backup wires 32 can be decreased.

The crank portions 35 are disposed at both of the side edges of the intersecting portion 32CP of the backup wires 32 as the first wires. In this way, the etchant infiltration path can be increased in length at both of the side edges of the intersecting portion 32CP of the backup wires 32, more reliably preventing disconnection of the source wires 24.

The crank portions 35 include the recess 36 and the protrusion 37 such that the recess 36 is recessed at one of the side edges of the intersecting portion 32CP of the backup wires 32 as the first wires in the direction in which the source wires 24 as the second wires extend, and the protrusion 37 protrudes at the other side edge in the direction in which the source wires 24 extend. In this way, the change in area of the intersecting portion 32CP of the backup wires 32 due to the provision of the crank portions 35 is minimized or eliminated, and thereby, the change in parasitic capacity that may be formed between the backup wires 32 and the source wires 24 can be minimized or eliminated. This is advantageous in controlling the voltage value applied to the backup wires 32 or the source wires 24, for example. Compared with the case in which the recesses are provided at both of the side edges of the intersecting portion 32CP, the wire resistance of the backup wires 32 can be maintained at a low level.

The recess 36 and the protrusion 37 are formed to have substantially the same area. In this way, there is substantially no change in area of the intersecting portion 32CP of the backup wires 32 as a result of the provision of the crank portions 35. Thus, the change in parasitic capacity that may be formed between the backup wires 32 and the source wires 24 can be substantially eliminated. Accordingly, the voltage values applied to the backup wires 32 and the source wires 24, for example, can be more advantageously controlled.

The recess 36 and the protrusion 37 are disposed such that they at least partially overlap with each other with respect to the direction in which the backup wires 32 as the first wires extend. In this way, the change in line width due to the provision of the crank portions 35 can be minimized or eliminated at the portion of the backup wires 32 at which the recess 36 and the protrusion 37 overlap with each other with respect to the direction in which the backup wires 32 extend. Thus, disconnection due to a pattern defect and the like caused during the patterning of the backup wires 32 can be made difficult to occur.

The recessed amount of the recess 36 and the protruding amount of the protrusion 37 are substantially same. In this way, the line width of the backup wires 32 at the portion where the recess 36 and the protrusion 37 overlap with each other with respect to the direction in which the backup wires 32 extend can be made equal to the line width of the backup wires 32 at the portions where the recess 36 and the protrusion 37 are not formed. Thus, disconnection and the like due to a pattern defect and the like caused during the patterning of the backup wires 32 can be made more difficult to occur.

The recess 36 and the protrusion 37 are disposed with their central positions substantially aligned with each other with respect to the direction in which the backup wires 32 as the first wires extend. In this way, the recess 36 and the protrusion 37 can be disposed to overlap with each other maximally with respect to the direction in which the backup wires 32 extend. Thus, disconnection and the like due to a pattern defect and the like during the patterning of the backup wires 32 can be made difficult to occur.

The recess 36 and the protrusion 37 have substantially the same length in the direction in which the backup wires 32 as the first wires extend. In this way, the line width of the backup wires 32 can be limited to two different widths at most, one for the portion in which the recess 36 and the protrusion 37 are formed and the other for the portions in which the recess 36 and the protrusion 37 are not formed. If the lengths of the recess and the protrusion differ from each other with respect to the direction in which the backup wires 32 extend, there would be three line widths for the backup wires 32, at most. Thus, compared thereto, the shape of the backup wires 32 can be simplified, whereby it becomes more difficult for disconnection and the like due to a pattern defect and the like to occur during the patterning of the backup wires 32.

The crank portions 35 disposed on the side edges of the intersecting portion 32CP of the backup wires 32 as the first wires have their central positions substantially aligned with each other with respect to the direction in which the backup wires 32 extend. In this way, even when the intersecting portion 24CP of the source wires 24 is eroded by the etchant, the remaining intersecting portion 24CP of the source wires 24 tends to more readily maintain a straight shape. Thus, the wire resistance of the source wires 24 can be maintained at a low level.

In the display area AA, the TFTs (switching components) 27 with the electrodes 27a, 27b, and 27c, and the source wires (electrode wires) 24 connected to the source electrodes 27b of the electrodes 27a, 27b, and 27c are disposed. In the non-display area NAA, the source wires 24 are extended to form the extension portions 24EX, and the backup wires 32 that intersect with the extension portions 24EX of the source wires 24 are disposed. The first wires are the backup wires 32, and the second wires are the source wires 24, which are electrode wires. In this way, in the event of disconnection in a source wire 24, the disconnected source wire 24 can be repaired by short-circuiting the extension portion 24EX of the source wire 24 and the backup wire 32 at the intersecting portions 24CP and 32CP. By providing the crank portions 35 at the intersecting portion 32CP of the backup wires 32 intersecting with the extension portions 24EX of the source wires 24, disconnection in the intersecting portion 24CP of the extension portions 24EX of the source wires 24 can be prevented. Thus, a line defect of the source wires 24 can be prevented, and thereby high display quality can be obtained.

The source wires 24 as the second wires are made of a metal material containing copper. In this way, compared with a case where the source wires are made of a metal material containing aluminum, the wire resistance of the source wires 24 can be made relatively small. When the source wires 24 are made of a metal material containing copper, the adhesive property of the source wires 24 with respect to the resist film R formed on the upper side of the source wires 24 may be degraded in patterning the source wires 24 on the upper side of the backup wires 32. In this case, the etchant may readily infiltrate the gap between the resist film R and the source wires 24, possibly resulting in disconnection of the source wires 24. In this respect, by providing the crank portions 35 at the side edges of the intersecting portion 32CP of the backup wires 32 intersecting with the source wires 24, the etchant infiltration path is increased in length. Thus, the disconnection of the source wires 24 can be effectively prevented.

The crank portions 35 are disposed at substantially the central position in the width direction of the source wires 24 as the second wires. In this way, the distances from the side edges of the source wires 24 to the crank portions 35 can be made substantially same. Thus, when the positional relationship between the backup wires 32 and the source wires 24 with respect to the direction in which the backup wires 32 extend is inspected after the wires have been patterned, for example, the interval between the side edges of the source wires 24 and the crank portions 35 can be used as an index for the inspection.

While the first embodiment of the present invention has been described above, the present invention is not limited to the embodiment and may include the following modifications. In the following modifications, components similar to those of the embodiment will be designated by similar reference signs, and their description and illustration may be omitted.

First Modification of the First Embodiment

The first modification of the first embodiment will be described with reference to FIG. 15. Here, the arrangement of a recess 36-1 and a protrusion 37-1, which are crank portions 35-1, is reversed.

Figure 15:
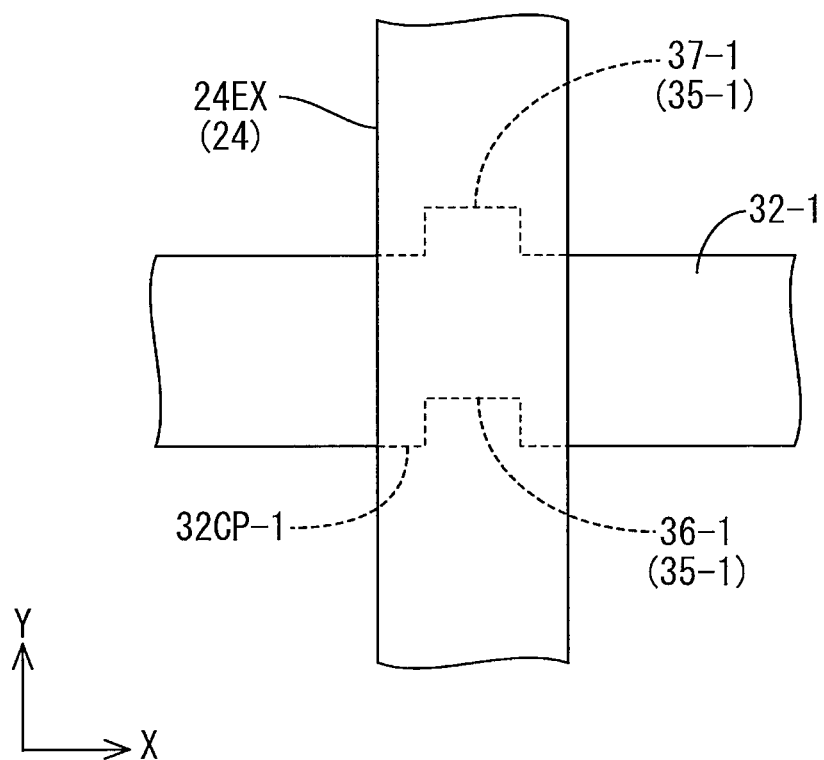
FIG. 15 is a planar view illustrating a planar configuration of the intersecting portions of the extension portion of the source wire and the backup wire in the non-display area according to the first modification of the first embodiment.

As depicted in FIG. 15, according to the present modification, the protrusion 37-1 is disposed at one of the side edges (upper side edge in FIG. 15) of an intersecting portion 32CP-1 of backup wires 32-1 that intersects with the extension portions 24EX of the source wires 24. The recess 36-1 is disposed at the other side edge (lower side edge in FIG. 15). Namely, according to the present modification, the arrangement of the recess 36-1 and the protrusion 37-1, which are the crank portions 35-1, is reversed from the arrangement according to the first embodiment described above.

Second Modification of the First Embodiment

The second modification of the first embodiment will be described with reference to FIG. 16. Here, only protrusions 37-2 are provided as crank portions 35-2.

Figure 16:
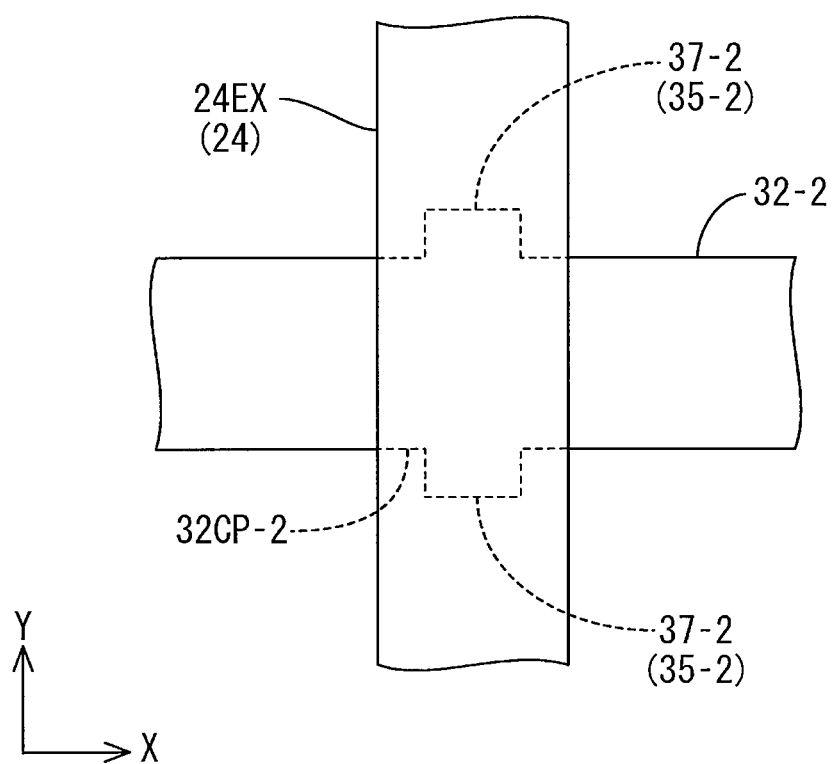
FIG. 16 is a planar view illustrating a planar configuration of the intersecting portions of the extension portion of the source wire and the backup wire in the non-display area according to the second modification of the first embodiment.

According to the present modification, as depicted in FIG. 16, only the protrusions 37-2 are provided at the side edges of an intersecting portion 32CP-2 of backup wires 32-2 that intersects with the extension portions 24EX of the source wires 24 to protrude in the direction in which the source wires 24 extend. The protrusions 37-2, as a pair, protrude from the side edges of the intersecting portion 32CP-2 of the backup wires 32-2 in opposite directions along the Y-axis direction. Each of the pair of protrusions 37-2 has a horizontally long square shape in a plan view, and both have substantially equal short side measurements, long side measurements, and areas. The pair of protrusions 37-2 is disposed at substantially the center in the width direction of the extension portions 24EX of the source wires 24 with their respective central positions substantially aligned with each other with respect to the X-axis direction.

Third Modification of the First Embodiment

The third modification of the first embodiment will be described with reference to FIG. 17. Here, only recesses 36-3 are provided as crank portions 35-2.

Figure 17:
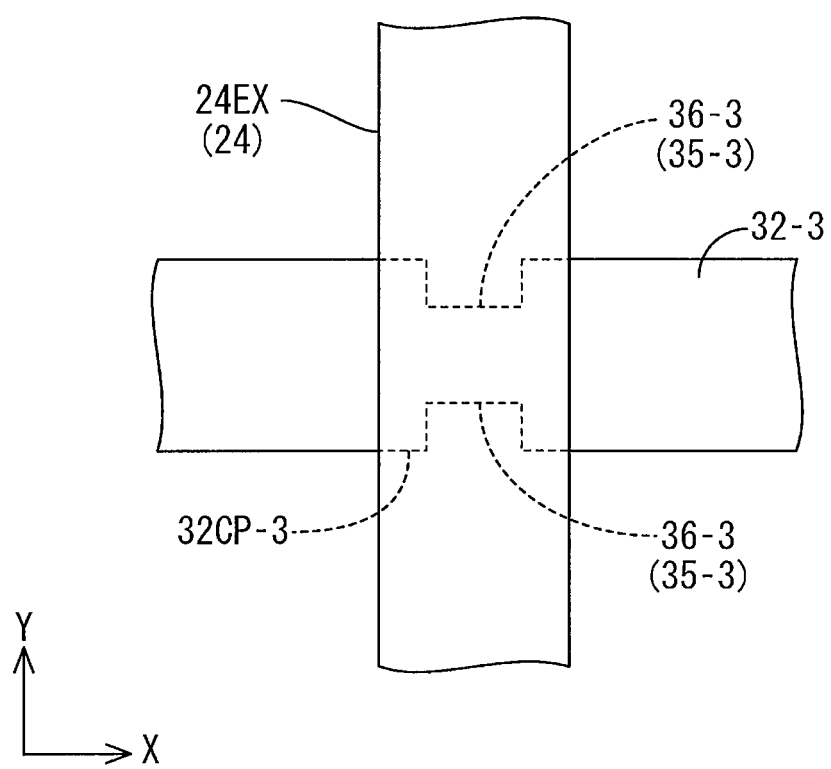
FIG. 17 is a planar view illustrating a planar configuration of the intersecting portions of the extension portion of the source wire and the backup wire in the non-display area according to the third modification of the first embodiment.

According to the present modification, as depicted in FIG. 17, only the recesses 36-3 are provided at the side edges of an intersecting portion 32CP-3 of backup wires 32-3 that intersects with the extension portions 24EX of the source wires 24 to be recessed in the direction in which the source wires 24 extend. The recesses 36-3, as a pair, are depressed inward from the side edges of the intersecting portion 32CP-3 of the backup wires 32-3 along the Y-axis direction. Each of the pair of recesses 36-3 has a horizontally long square shape in a plan view, and both have substantially equal short side measurements, long side measurements, and areas. The pair of recesses 36-3 is disposed substantially at the center in the width direction of the extension portions 24EX of the source wires 24 with their central positions substantially aligned with each other with respect to the X-axis direction.

Fourth Modification of the First Embodiment

The fourth modification of the first embodiment will be described with reference to FIG. 18. Here, a pair of recesses 36-4 and a pair of protrusions 37-4 are provided as crank portions 35-4.

Figure 18:
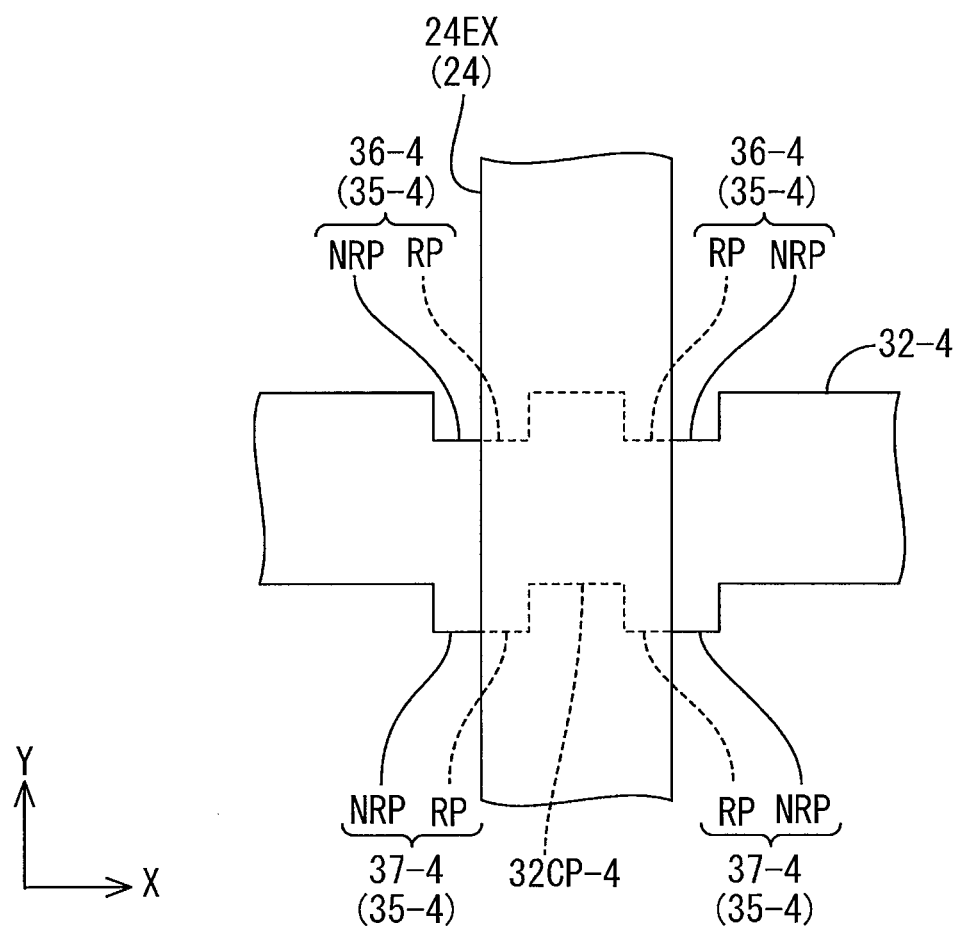
FIG. 18 is a planar view illustrating a planar configuration of the intersecting portions of the extension portion of the source wire and the backup wire in the non-display area according to the fourth modification of the first embodiment.

According to the present modification, as depicted in FIG. 18, the pair of recesses 36-4 is disposed at one of the side edges of an intersecting portion 32CP-4 of backup wires 32-4 that intersects with the extension portions 24EX of the source wires 24, with a space between the pair with respect to the X-axis direction. On the other side edge, the pair of protrusions 37-4 is disposed with a space therebetween with respect to the X-axis direction. The recesses 36-4 and the protrusions 37-4 have a horizontally long square shape in a plan view, and have substantially equal short side measurements, long side measurements, and areas. The recesses 36-4 and the protrusions 37-4 are aligned with respect to the X-axis direction such that the recesses 36-4 and the protrusions 37-4 are disposed back to back with each other.

Specifically, the recesses 36-4 and the protrusions 37-4 are disposed with their central positions in the long side direction substantially aligned with the side edges of the extension portions 24EX of the source wires 24. Namely, approximately a half of each of the recesses 36-4 and the protrusions 37-4 with respect to the long side direction provides an overlapping portion RP overlapping with the extension portions 24EX of the source wires 24 in a plan view, and the remaining half provides a non-overlapping portion NRP that does not overlap with the extension portions 24EX of the source wires 24 in a plan view. Thus, even when the source wires 24 are displaced from a normal position with respect to the X-axis direction due to a manufacturing error and the like, the non-overlapping portion NRP functions as a displacement buffer such that the recesses 36-4 and the protrusions 37-4 are ensured to partially overlap with the extension portions 24EX of the source wires 24 in a plan view. Further, the intervals (distances) between the short sides of the recesses 36-4 and the protrusions 37-4 and the side edges of the extension portions 24EX of the source wires 24 are substantially equal. Thus, the short sides of the recesses 36-4 and the protrusions 37-4 can be utilized as an inspection index when inspecting the positions of the patterned source wires 24 with respect to the X-axis direction.

As described above, according to the present modification, the crank portions 35-4 are disposed to have the overlapping portion RP overlapping with the source wires 24 as the second wires and the non-overlapping portion NRP not overlapping with the source wires 24. In this way, even when the source wires 24 are displaced, during the patterning of the source wires 24, from a normal position with respect to the direction in which the backup wires 32-4 extend, the crank portions 35-4 can be made to reliably overlap with the source wires 24 as long as the displaced amount is within a range not exceeding the non-overlapping portion NRP. Thus, the function of the crank portions 35-4 can be more reliably exploited.

The crank portions 35-4 are disposed with their central positions in the direction in which the backup wires 32-4 extend overlapping with the side edges of the source wires 24. In this way, the distances from the side edges of the crank portions 35-4 to the side edges of the source wires 24 are made equal. Thus, when the positional relationship between the backup wires 32-4 and the source wires 24 with respect to the direction in which the backup wires 32-4 extend is inspected after patterning, for example, the interval between the side edges of the crank portions 35-4 and the side edges of the source wires 24 can be used as an inspection index.

Fifth Modification of the First Embodiment

The fifth modification of the first embodiment will be described with reference to FIG. 19. Here, the arrangement of recesses 36-5 and protrusions 37-5 as crank portions 35-5 are reversed from the above fourth modification.

Figure 19:
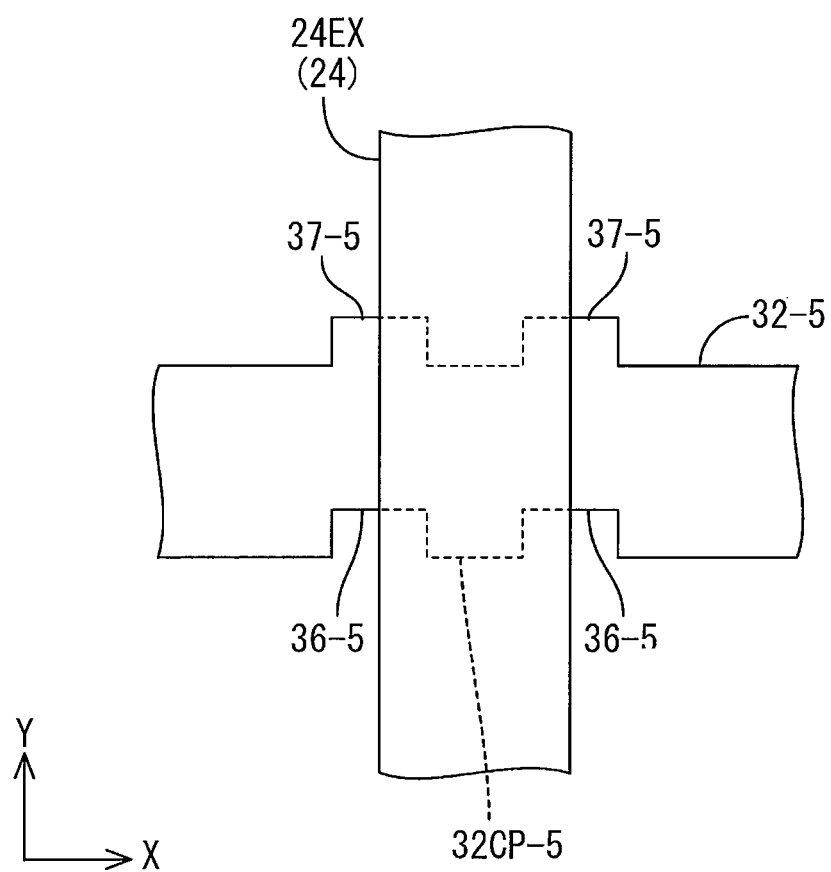
FIG. 19 is a planar view illustrating a planar configuration of the intersecting portions of the extension portion of the source wire and the backup wire in the non-display area according to the fifth modification of the first embodiment.

According to the present modification, as depicted in FIG. 19, a pair of protrusions 37-5 is provided on one of the side edges of an intersecting portion 32CP-5 of backup wires 32-5 that intersects with the extension portions 24EX of the source wires 24. On the other side edge, a pair of recesses 36-5 is provided. Namely, according to the present modification, the arrangement of the pair of recesses 36-5 and the pair of protrusions 37-5, which are the crank portions 35-5, is reversed from the fourth modification described above.

Sixth Modification of the First Embodiment

The sixth modification of the first embodiment will be described with reference to FIG. 20. According to the present modification, which is a further modification of the fourth modification described above, only protrusions 37-6 are provided as crank portions 35-6.

Figure 20:
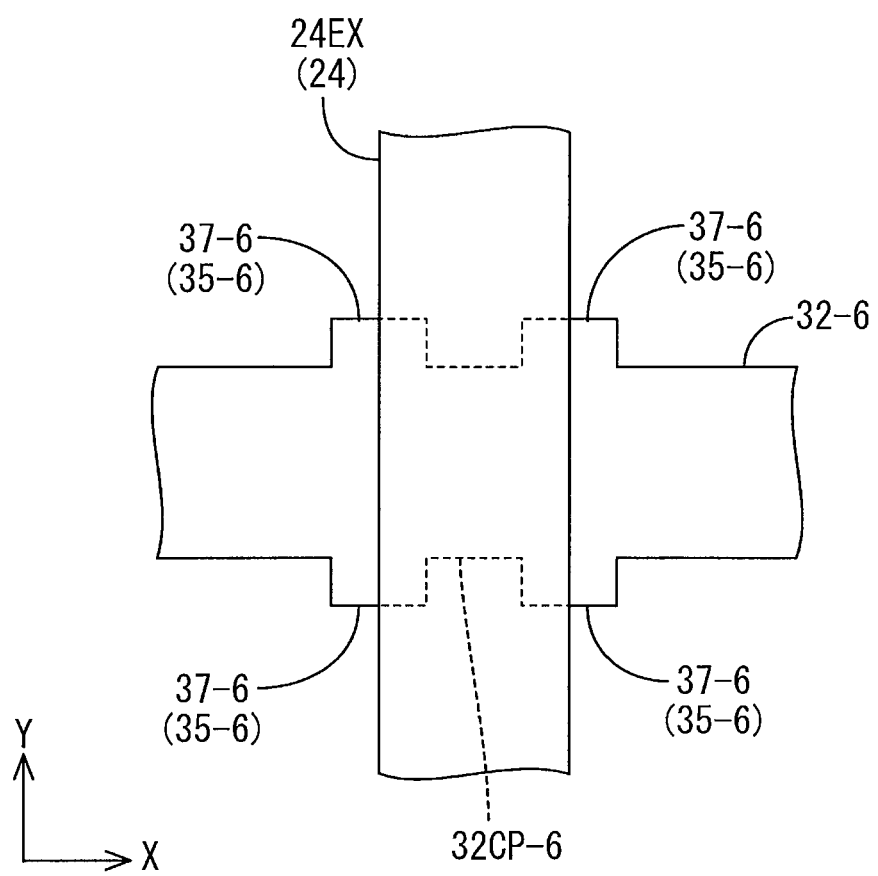
FIG. 20 is a planar view illustrating a planar configuration of the intersecting portions of the extension portion of the source wire and the backup wire in the non-display area according to the sixth modification of the first embodiment.

According to the present modification, as depicted in FIG. 20, a pair of the protrusions 37-6 protruding in the direction in which the source wires 24 extend is provided on each of the side edges of an intersecting portion 32CP-6 of backup wires 32-6 that intersects with the extension portions 24EX of the source wires 24. The pair of protrusions 37-6 on one of the side edges of the intersecting portion 32CP-6 of the backup wires 32-6 and the other pair of protrusions 37-6 on the other side edge protrude in opposite directions along the Y-axis direction. The shape, arrangement (relationship with the extension portions 24EX of the source wires 24), and the like of the protrusions 37-6 are same as those of the recesses 36-4 and the protrusions 37-4 according to the fourth modification described above, and therefore their redundant description will be omitted.

Seventh Modification of the First Embodiment

The seventh modification of the first embodiment will be described with reference to FIG. 21. According to the present modification, which is a further modification of the fourth modification described above, only recesses 36-7 are provided as crank portions 35-7.

Figure 21:
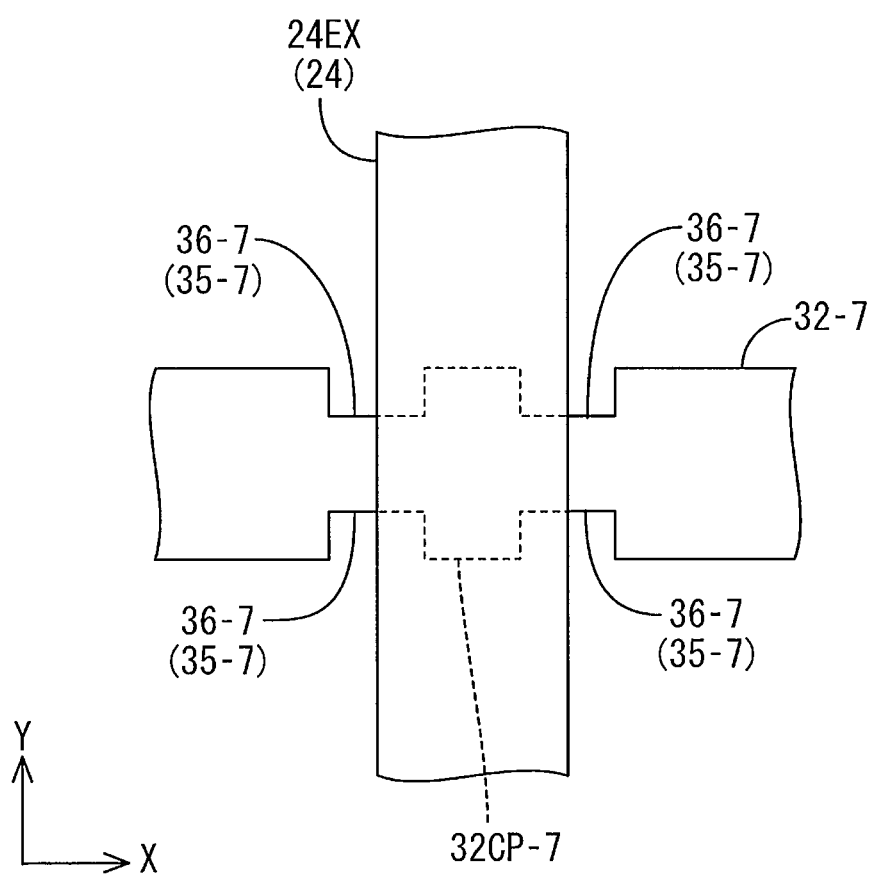
FIG. 21 is a planar view illustrating a planar configuration of the intersecting portions of the extension portion of the source wire and the backup wire in the non-display area according to the seventh modification of the first embodiment.

According to the present modification, as depicted in FIG. 21, a pair of the recesses 36-7 is provided on each of the side edges of an intersecting portion 32CP-7 of backup wires 32-7 that intersects with the extension portions 24EX of the source wires 24, to protrude in the direction in which the source wires 24 extend. The pair of the recesses 36-7 on one of the side edges of the intersecting portion 32CP-7 of the backup wires 32-7 and the other pair of recesses 36-7 on the other side edge is inwardly depressed along the Y-axis direction. The shape, arrangement (relationship with the extension portions 24EX of the source wires 24), and the like of the recesses 36-7 are same as those of the recesses 36-4 and the protrusions 37-4 according to the fourth modification, and therefore their redundant description will be omitted.

Eighth Modification of the First Embodiment

Figure 22:
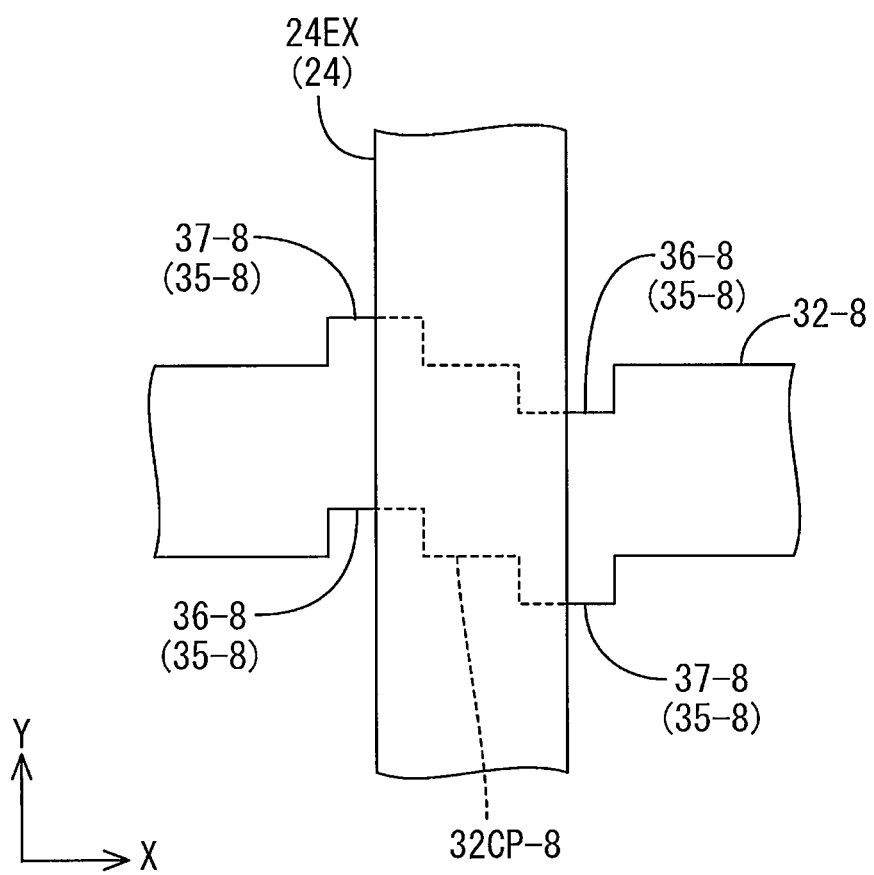
FIG. 22 is a planar view illustrating a planar configuration of the intersecting portions of the extension portion of the source wire and the backup wire in the non-display area according to the eighth modification of the first embodiment.

An eighth modification of the first embodiment will be described with reference to FIG. 22. Here, a recess 36-8 and a protrusion 37-8 are provided, as crank portions 35-8, at each of the side edges of an intersecting portion 32CP-8 of backup wires 32-8.

According to the present modification, as depicted in FIG. 21, the protrusion 37-8 and the recess 36-8 are provided at one of the side edges of the intersecting portion 32CP-8 of the backup wires 32-8 intersecting with the extension portions 24EX of the source wires 24. At the other side edge, there are also provided the recess 36-8 and the protrusion 37-8. The protrusion 37-8 at one of the side edges of the intersecting portion 32CP-8 of the backup wires 32-8 and the recess 36-8 at the other side edge are aligned with respect to the X-axis direction to be disposed back to back with each other. Similarly, the recess 36-8 on one side edge and the protrusion 37-8 on the other side edge are aligned with respect to the X-axis direction to be disposed back to back with each other. The shape, arrangement (relationship with the extension portions 24EX of the source wires 24), and the like of the recesses 36-8 and the protrusions 37-8 are similar to those of the recesses 36-4 and the protrusions 37-4 according to the fourth modification described above, and therefore their redundant description will be omitted.

Ninth Modification of the First Embodiment

The ninth modification of the first embodiment will be described with reference to FIG. 23. Here, the arrangement of a recess 36-9 and a protrusion 37-9 as crank portions 35-9 is modified.

Figure 23:
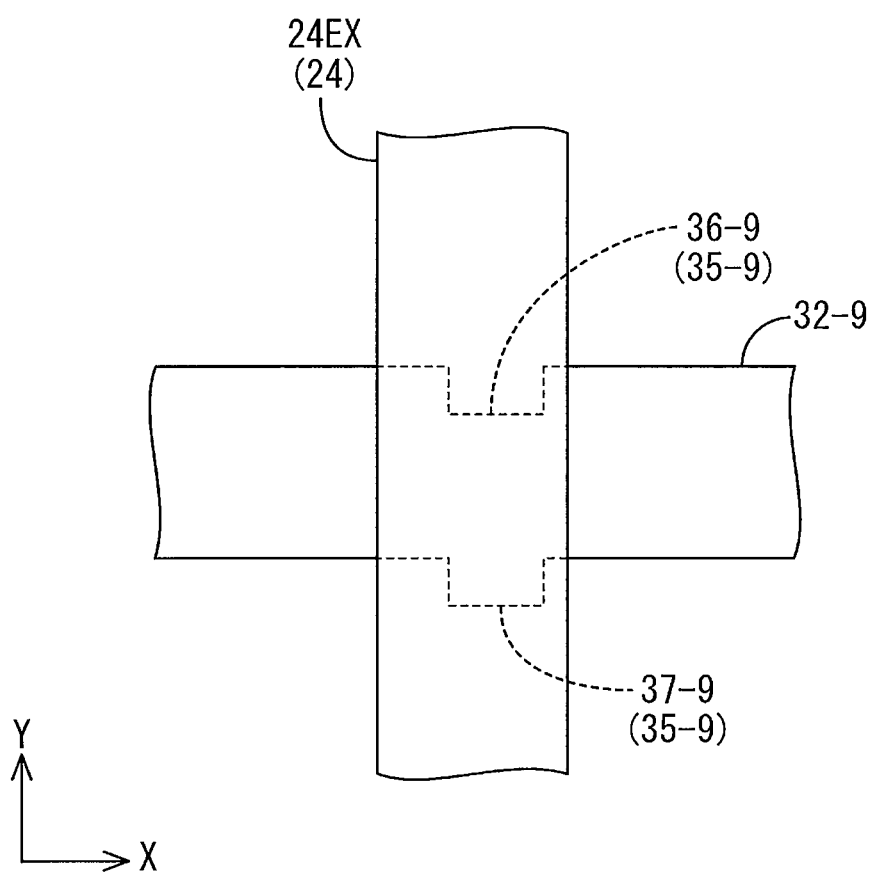
FIG. 23 is a planar view illustrating a planar configuration of the intersecting portions of the extension portion of the source wire and the backup wire in the non-display area according to the ninth modification of the first embodiment.

According to the present modification, as depicted in FIG. 23, the recess 36-9 and the protrusion 37-9 as the crank portions 35-9 are disposed closer to one of the side edges of the extension portions 24EX of the source wires 24. Specifically, the recess 36-9 and the protrusion 37-9 are disposed with their central positions with respect to the direction in which the backup wires 32-9 extend (X-axis direction) displaced from the center of the extension portions 24EX of the source wires 24 in the width direction toward the right in FIG. 23.

Tenth Modification of the First Embodiment

The tenth modification of the first embodiment will be described with reference to FIG. 24. Here, a recess 36-10 and a protrusion 37-10 as crank portions 35-10 are displaced from each other.

Figure 24:
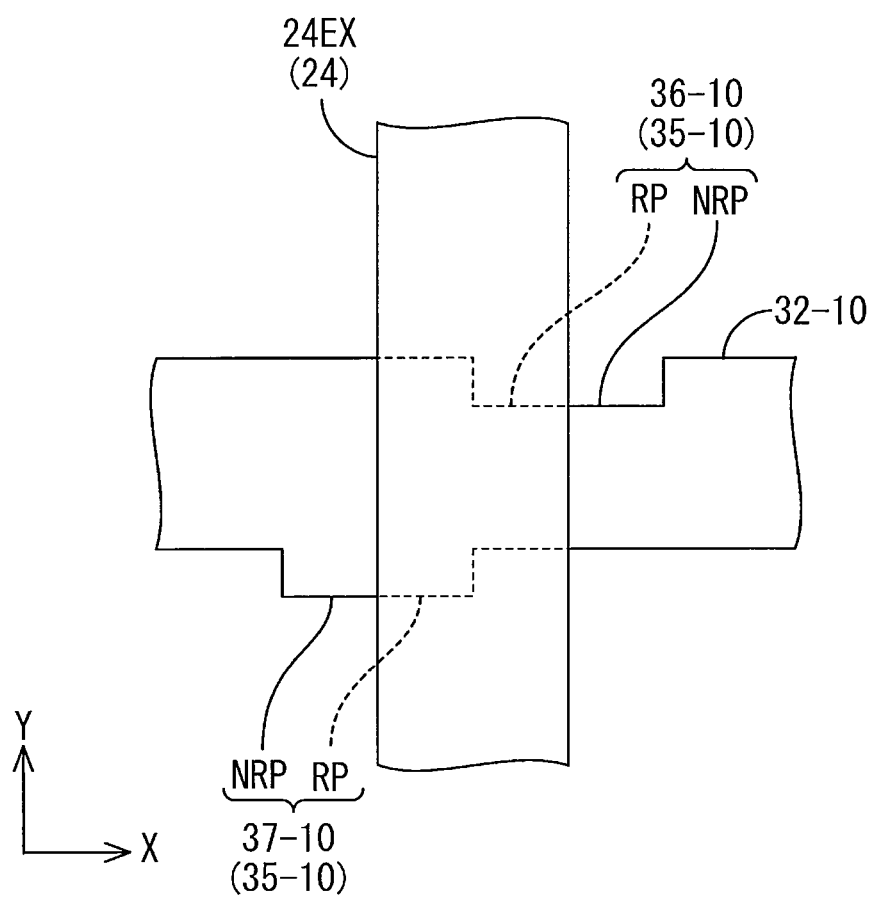
FIG. 24 is a planar view illustrating a planar configuration of the intersecting portions of the extension portion of the source wire and the backup wire in the non-display area according to the tenth modification of the first embodiment.

According to the present modification, as depicted in FIG. 24, the recess 36-10 and the protrusion 37-10 as the crank portions 35-10 are displaced from each other with respect to the direction in which the backup wires 32-10 extend (X-axis direction). Specifically, the recess 36-10 is disposed with its central position in the long side direction substantially aligned with one of the side edges of the extension portions 24EX of the source wires 24, while the protrusion 37-10 is disposed with its central position in the long side direction substantially aligned with the other side edge of the extension portions 24EX of the source wires 24. Thus, approximately a half of each of the recess 36-10 and the protrusion 37-10 with respect to the long side direction provides an overlapping portion RP that overlaps with the extension portions 24EX of the source wires 24 in a plan view, with the remaining, approximately one half portion of each providing a non-overlapping portion NRP that does not overlap with the extension portions 24EX of the source wires 24 in a plan view. The recess 36-10 and the protrusion 37-10 have substantially a long side measurement same as measurement of the line width of the extension portions 24EX of the source wires 24, and do not overlap with each other with respect to the X-axis direction.

Eleventh Modification of the First Embodiment

The eleventh modification of the first embodiment will be described with reference to FIG. 25. According to the present modification, which is a further modification of the tenth modification described above, the positional relationship between a recess 36-11 and a protrusion 37-11 as crank portions 35-11 is modified.

Figure 25:
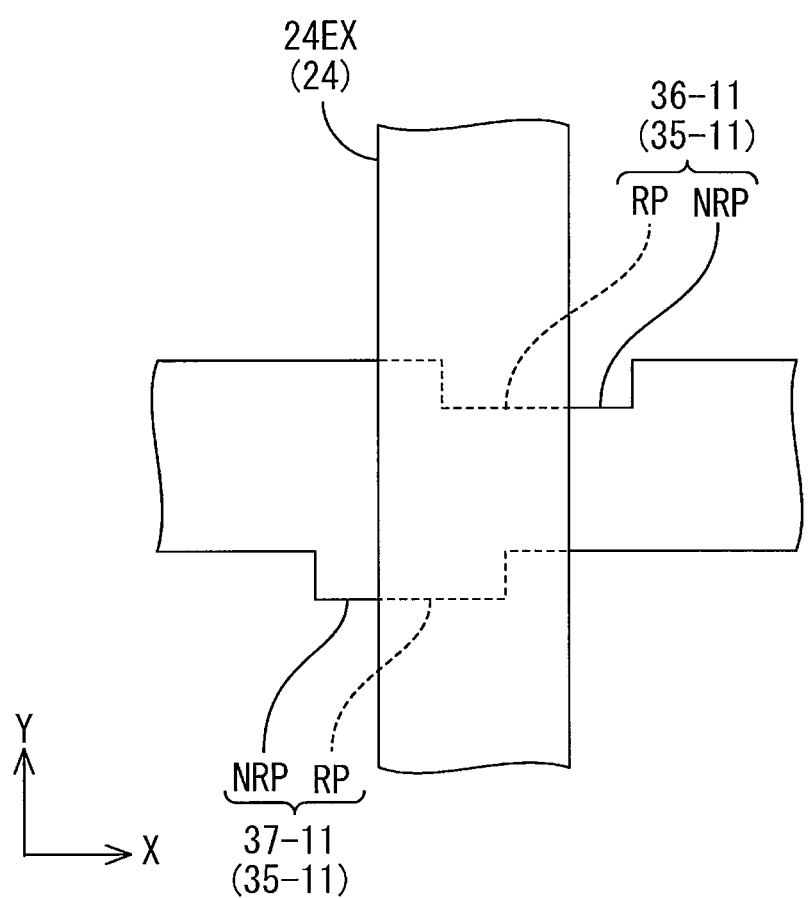
FIG. 25 is a planar view illustrating a planar configuration of the intersecting portions of the extension portion of the source wire and the backup wire in the non-display area according to the eleventh modification of the first embodiment.

According to the present modification, as depicted in FIG. 25, the recess 36-11 and the protrusion 37-11 as the crank portions 35-11 partially overlap with each other with respect to the X-axis direction. Specifically, the recess 36-11 and the protrusion 37-11 have the overlapping portions RP with the extension portions 24EX of the source wires 24, of which measurement is more than one half (such as ⅔) the entire length of the recess 36-11 and the protrusion 37-11.

Twelfth Modification of the First Embodiment

The twelfth modification of the first embodiment will be described with reference to FIG. 26. According to the present modification, which is a further modification of the fifth modification described above, recesses 36-12 and protrusions 37-12, both are crank portions 35-12, are displaced from each other.

Figure 26:
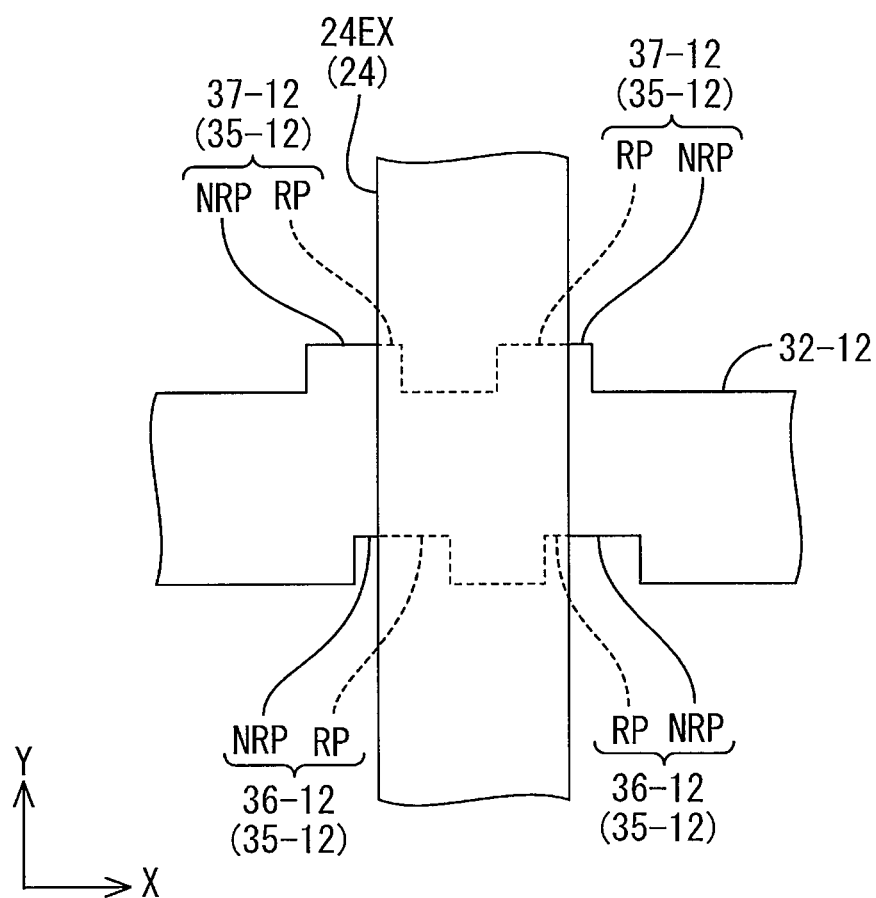
FIG. 26 is a planar view illustrating a planar configuration of the intersecting portions of the extension portion of the source wire and the backup wire in the non-display area according to the twelfth modification of the first embodiment.

According to the present modification, as depicted in FIG. 26, a pair of recesses 36-12 and a pair of protrusions 37-12 as the crank portions 35-12 are displaced from each other with respect to the direction in which backup wires 32-12 extend (X-axis direction). Specifically, the recesses 36-12 and the protrusions 37-12 are disposed with their respective central positions in the long side direction displaced from the side edges of the extension portions 24EX of the source wires 24. The pair of recesses 36-12 is disposed at positions such that the overlapping portion RP of one of the recesses 36-12 (the left one in FIG. 26) overlapping with the extension portions 24EX of the source wires 24 has substantially the same area as the non-overlapping portion NRP of the other recess 36-12 (the right one in FIG. 26). Likewise, the pair of protrusions 37-12 is disposed at positions such that the non-overlapping portion NRP of one of the protrusions 37-12 (the left one in FIG. 26) has substantially the same area as the overlapping portion RP of the other protrusion 37-12 (the right one in FIG. 26) overlapping with the extension portions 24EX of the source wires 24. One of the recesses 36-12 and one of the protrusions 37-12 are disposed partially overlapping with each other with respect to the X-axis direction. Similarly, the other of the recesses 36-12 and the other of the protrusions 37-12 are disposed partially overlapping with each other with respect to the X-axis direction.

Thirteenth Modification of the First Embodiment

The thirteenth modification of the first embodiment will be described with reference to FIG. 27. According to the present modification, which is a further modification of the sixth modification described above, protrusions 37-13 as crank portions 35-13 are displaced from each other.

Figure 27:
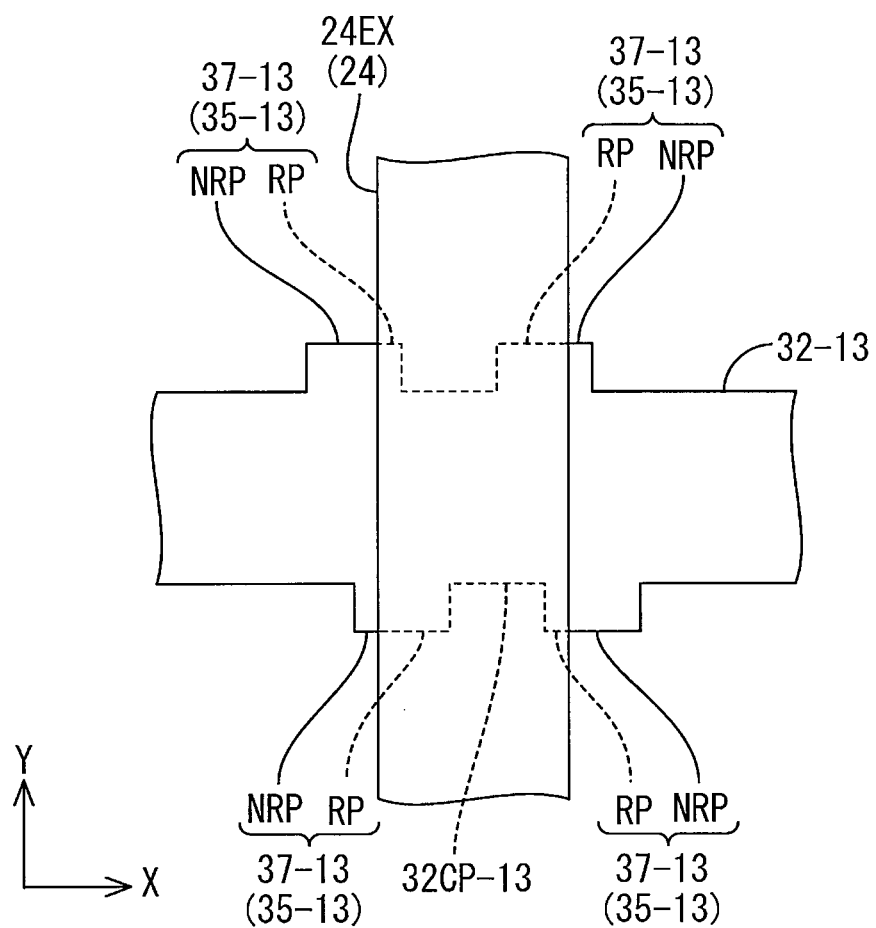
FIG. 27 is a planar view illustrating a planar configuration of the intersecting portions of the extension portion of the source wire and the backup wire in the non-display area according to the thirteenth modification of the first embodiment.

According to the present modification, as depicted in FIG. 27, a pair of protrusions 37-13 disposed on one of the side edges of an intersecting portion 32CP-13 of backup wires 32-13 that intersects with the extension portions 24EX of the source wires 24 is displaced from another pair of protrusions 37-13 disposed on the other side edge with respect to the direction in which the backup wires 32-12 extend (X-axis direction). The relative positional relationship between the protrusions 37-13 on one side edge and the protrusions 37-13 on the other side edge with respect to the X-axis direction, and the overlapping positional relationship of the protrusions 37-13 with the extension portions 24EX of the source wires 24 are same as the corresponding relationships for the recesses 36-12 and the protrusions 37-12 according to the twelfth modification described above, and therefore their redundant description will be omitted.

Fourteenth Modification of the First Embodiment

The fourteenth modification of the first embodiment will be described with reference to FIG. 28. According to the present modification, which is a further modification of the fourth modification described above, a pair of recesses 36-14 and a pair of protrusions 37-14 as crank portions 35-14 are disposed entirely overlapping with the extension portions 24EX of the source wires 24.

Figure 28:
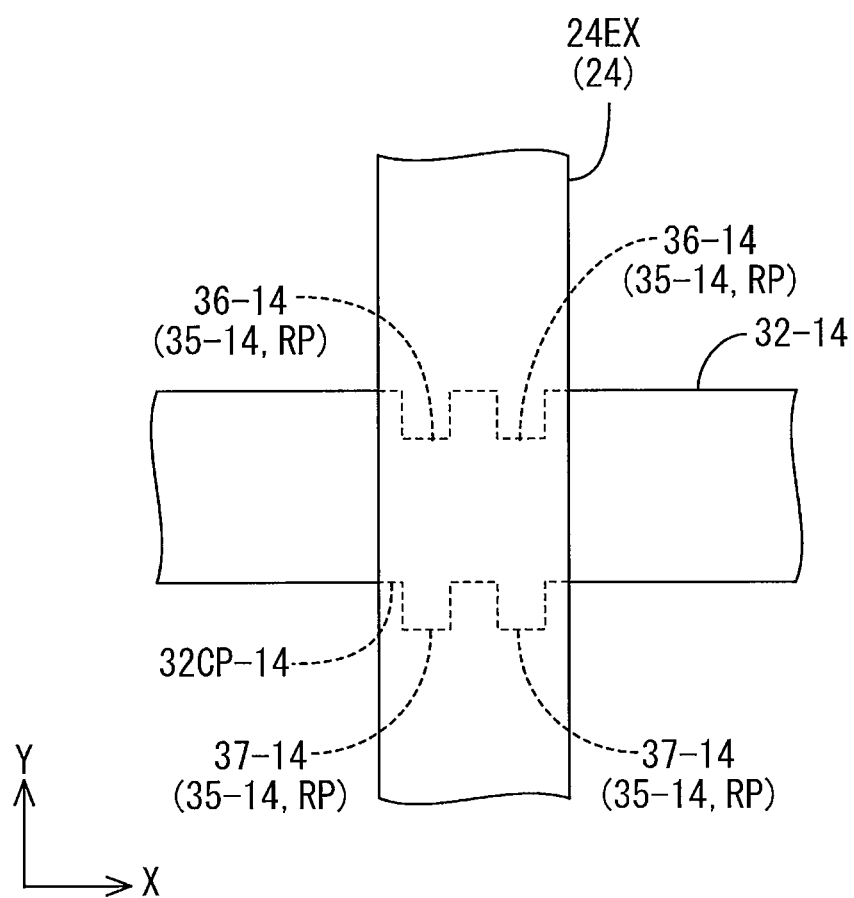
FIG. 28 is a planar view illustrating a planar configuration of the intersecting portions of the extension portion of the source wire and the backup wire in the non-display area according to the fourteenth modification of the first embodiment.

According to the present modification, as depicted in FIG. 28, the pair of recesses 36-14 and the pair of protrusions 37-14 are respectively disposed on each of the side edges of an intersecting portion 32CP-14 of backup wires 32-14 that overlaps with the extension portions 24EX of the source wires 24 to entirely overlap with the extension portions 24EX of the source wires 24. Specifically, the recesses 36-14 and the protrusions 37-14 have a substantially square shape in a plan view, with each side of the square measuring smaller than one half (such as ¼) the line width of the extension portions 24EX of the source wires 24. The recesses 36-14 and the protrusions 37-14 provide the overlapping portions RP that entirely overlap with the extension portions 24EX of the source wires 24.

Second Embodiment

The second embodiment of the present invention will be described with reference to FIG. 29. According to the second embodiment, the wiring configuration on an array substrate 120 is modified. Redundant description of structures, operations, and effects similar to those of the first embodiment will be omitted. In the following, illustration and description of the backup wires 32, which have been described above with reference to the first embodiment, will be omitted.

Figure 29:
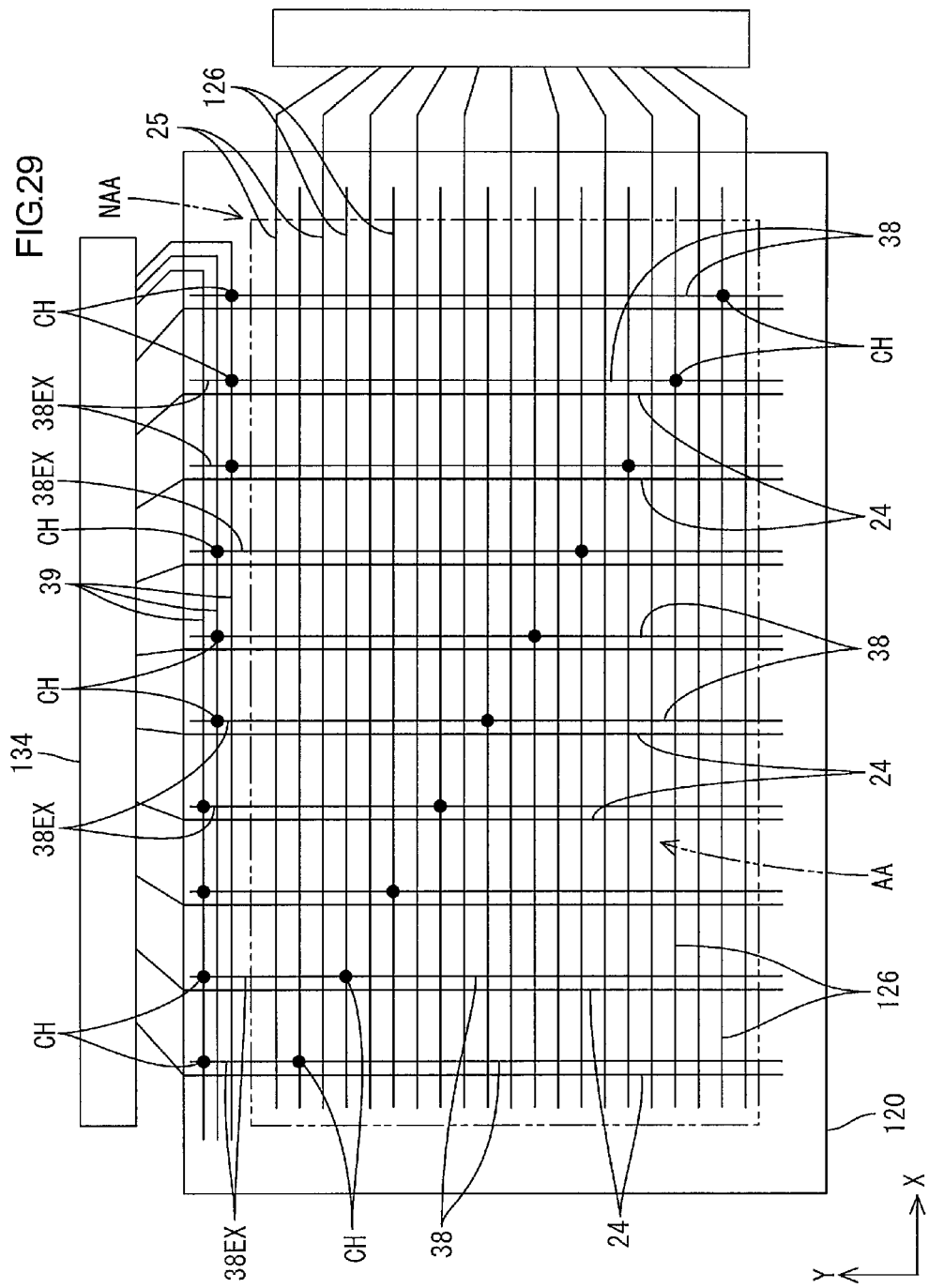
FIG. 29 is a planar view schematically illustrating a wiring configuration in the liquid crystal panel according to the second embodiment of the present invention.

According to the present embodiment, as depicted in FIG. 29, the array substrate 120 has a modified wiring configuration such that storage capacitor wires 126 are connected to a source driver 134. Specifically, on the inner surface side of the array substrate 120, connecting wires (the second wires) 38 and routing wires (the first wires, Cs trunk) 39 are provided. The connecting wires 38 run parallel with the source wires 24 and are connected to the storage capacitor wires 126 in the display area AA, and routing wires (the first wires, Cs trunk) 39 are connected to the connecting wires 38 in the non-display area NAA and to the source driver 134.

The connecting wires 38 extend next to the source wires 24 and along the Y-axis direction, with a slight gap between the connecting wires 38 and the adjacent source wires 24. A plurality of connecting wires 38 are provided such that each of the connecting wires 38 corresponds to each of the source wires 24. The connecting wires 38 traverse the entire length of the display area AA along its short side direction in the same way as the source wires 24. The connecting wires 38 include extension portions 38EX extending to the end portions of the non-display area NAA on the long sides thereof. In the display area AA, the connecting wires 38 intersect with and traverse all of the gate wires 25 and all of the storage capacitor wires 126, and are electrically connected with the predetermined storage capacitor wires 126 via contact holes CH in their intersecting portions. The connecting wires 38 are provided in the same process, by using the same material, and in the same layer (order of stacking) as for the source wires 24.

The routing wires 39 are disposed on one of the end portions of the array substrate 120 on the long sides thereof in the non-display area NAA, that is, the closer one to the source driver 134 which is the supply source of various signals. A plurality of the routing wires 39 extend along the X-axis direction; namely, in the direction in which the gate wires 25 and the storage capacitor wires 126 extend. The routing wires 39 are provided in the same process by using the same material and in the same layer (order of stacking) as for the gate wires 25 and the storage capacitor wires 126. Thus, the routing wires 39 are disposed on the lower side with respect to the connecting wires 38 described above. In other words, the connecting wires 38 are disposed on the upper side with respect to the routing wires 39. The routing wires 39 intersect with and traverse all of the extension portions 38EX of the connecting wires 38 via the gate insulating film 29. The connecting wires 38 are electrically connected with, via the contact holes CH, the predetermined routing wires 39 intersecting therewith. By adopting such a wiring configuration, the source driver 134 can supply a reference potential to the storage capacitor wires 126 via the routing wires 39 and the connecting wires 38 that are connected to each other.

As described above, the routing wires 39 intersect with the extension portions 38EX of all of the connecting wires 38. Thus, in the intersecting portions of the connecting wires 38 intersecting with the routing wires 39, disconnection may be caused by etchant infiltration during the patterning of the connecting wires 38. Such disconnection of the connecting wires 38 can be prevented in a preferred manner by providing crank portions similar to those according to the first embodiment described above (see FIG. 7) at the intersecting portions of the connecting wires 38 intersecting with the routing wires 39.

As described above, according to the present embodiment, in the display area AA, there are provided the TFTs (switching components) 27 including the source electrodes 27b, the gate electrodes 27a, and the drain electrodes 27c; the source wires 24 connected to the source electrodes 27b; the gate wires 25 connected to the gate electrodes 27a and intersecting with the source wires 24; the pixel electrodes 28 connected to the drain electrodes 27c; the storage capacitor wires 126 running parallel with the gate wires 25 and opposed to the pixel electrodes 28 while forming a capacitance therewith; and the connecting wires 38 running parallel with the source wires 24 and connected to the storage capacitor wires 126. In the non-display area NAA, the source wires 24 and the connecting wires 38 are extended to form the extension portions 24EX and 38EX, and the routing wires 39 intersect with the extension portions 24EX and 38EX of the source wires 24 and the connecting wires 38 and are connected to the connecting wires 38. The first wires are the routing wires 39, and the second wires are the source wires 24. In this way, the storage capacitor wires 126, which form the capacitance with the pixel electrodes 28, can receive the supply of a reference voltage, for example, from the source driver 134 as an external circuit, via the connecting wires 38 and the routing wires 39. By providing the crank portions 35 to the intersecting portion of the routing wires 39 intersecting with the extension portions 24EX of the source wires 24, disconnection in the intersecting portion with the extension portions 24EX of the source wires 24 can be prevented. Thus, a line defect in the source wires 24 can be prevented, whereby high display quality can be obtained.

Third Embodiment

The third embodiment of the present invention will be described with reference to FIG. 30. According to the third embodiment, an array substrate 220 has a wiring configuration further modified from the second embodiment described above. Redundant description of structures, operations, and effects similar to those of the second embodiment will be omitted.

Figure 30:
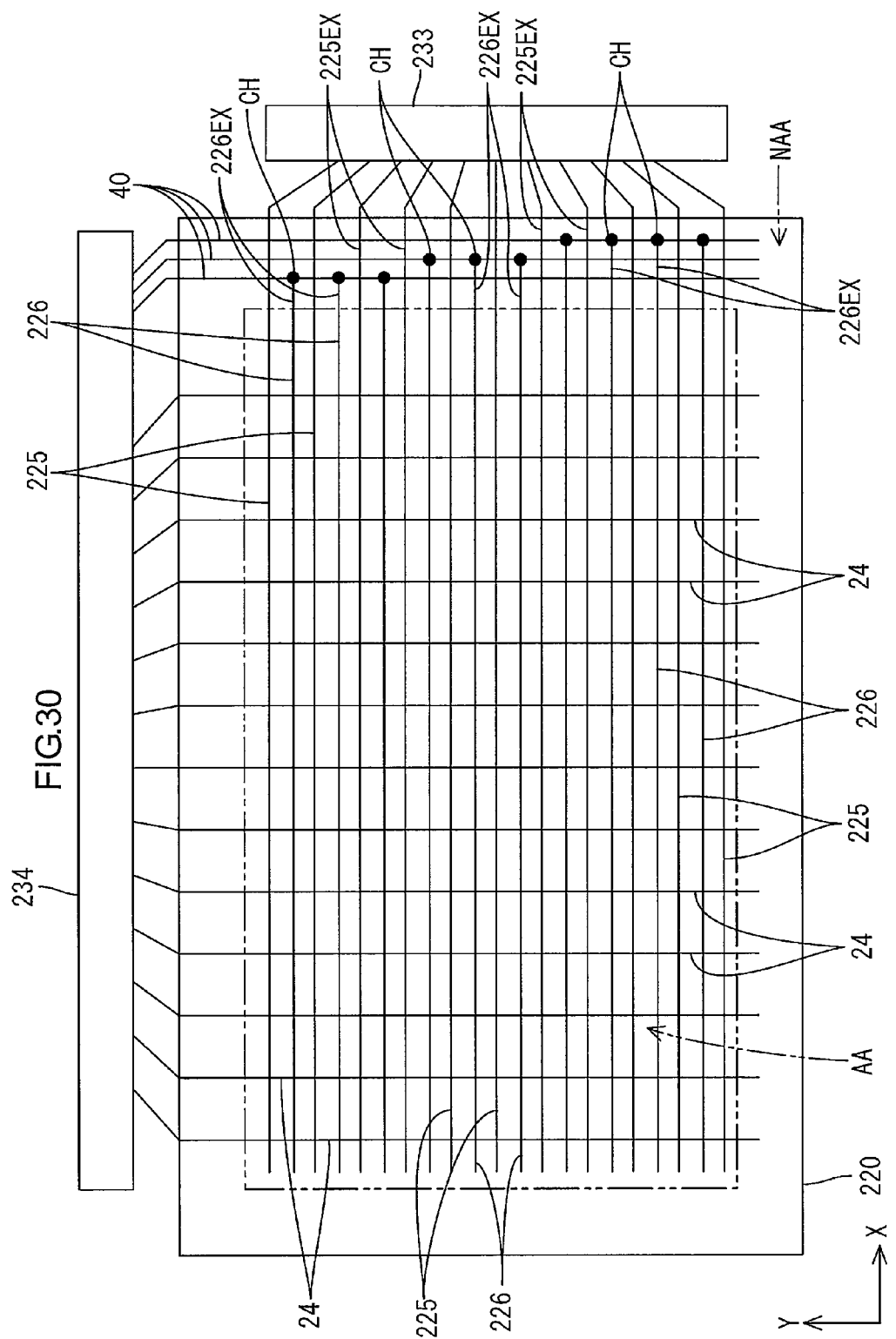
FIG. 30 is a planar view schematically illustrating a wiring configuration in the liquid crystal panel according to the third embodiment of the present invention.

According to the present embodiment, as depicted in FIG. 30, a wiring configuration in which storage capacitor wires 226 are connected to a source driver 234 without using the connecting wires 38 according to the second embodiment described above is adopted. Specifically, on the inner surface side of the array substrate 220, routing wires (the second wires, Cs trunk) 40 are provided, which are connected to extension portions 226EX of the storage capacitor wires 226 in the non-display area NAA and to the source driver 234.

The routing wires 40 are disposed in one of the end portions of the array substrate 220 on the short sides thereof in the non-display area NAA, the closer one to a gate driver 233 which is a supply source for a scan signal and the like to the gate wires 225. A plurality of routing wires 40 extends in the Y-axis direction; namely, along the direction in which the source wires 24 extend. The routing wires 40 are provided in the same process by using the same material and in the same layer (order of stacking) as for the source wires 24. Thus, the routing wires 40 are disposed on the lower side with respect to the gate wires 225 and the storage capacitor wires 226 (the first wires). The routing wires 40 intersect with and traverse extension portions 225EX of all of the gate wires 225 and the extension portions 226EX of all of the storage capacitor wires 226 via the gate insulating film 29. The storage capacitor wires 226 are electrically connected, via the contact holes CH, with the predetermined one of the routing wires 40 intersecting with the extension portions 226EX. By adopting such a wiring configuration, the source driver 234 can supply a reference potential to the storage capacitor wires 226 via the connected routing wires 40.

As described above, the routing wires 40 intersect with the extension portions 225EX and 226EX of all of the gate wires 225 and storage capacitor wires 226. Thus, in the intersecting portions of the extension portions 225EX and 226EX intersecting with the routing wires 40, disconnection may be caused by etchant infiltration during the patterning of the routing wires 40. Accordingly, by providing crank portions similar to those according to the first embodiment described above (see FIG. 7) to the intersecting portions of the extension portions 225EX and 226EX with the routing wires 40, disconnection of the routing wires 40 can be prevented in a preferred manner.

As described above, according to the present embodiment, in the display area AA, there are provided TFTs (switching components) 27 including the source electrode 27b, the gate electrode 27a, and the drain electrode 27c; the source wires 24 connected to the source electrode 27b; the gate wires 225 connected to the gate electrode 27a and intersecting with the source wires 24; the pixel electrodes 28 connected to the drain electrode 27c; and the storage capacitor wires 226 running parallel with the gate wires 225 and opposed to the pixel electrodes 28 while forming a capacitance therewith. In the non-display area NAA, the storage capacitor wires 226 are extended to form the extension portions 226EX, and the routing wires 40 intersect with the extension portions 226EX of the storage capacitor wires 226 and are connected to the extension portions 226EX of the storage capacitor wires 226. The first wires are the storage capacitor wires 226, and the second wires are the routing wires 40. In this way, the storage capacitor wires 226 that form the capacitance with the pixel electrodes 28 can be supplied with a reference voltage, for example, from the source driver 234 as an external circuit via the routing wires 40. By providing the crank portions 35 at the intersecting portions of the extension portions 226EX of the storage capacitor wires 226 intersecting with the routing wires 40, disconnection in the intersecting portions of the routing wires 40 can be prevented. Thus, a line defect in the storage capacitor wires 226 connected to the routing wires 40 can be prevented, whereby high display quality can be obtained.

Fourth Embodiment

The fourth embodiment of the present invention will be described with reference to FIG. 31. According to the fourth embodiment, an array substrate 320 with a wiring configuration further modified from the third embodiment described above will be described. Redundant description of structures, operations, and effects similar to those of the third embodiment will be omitted.

Figure 31:
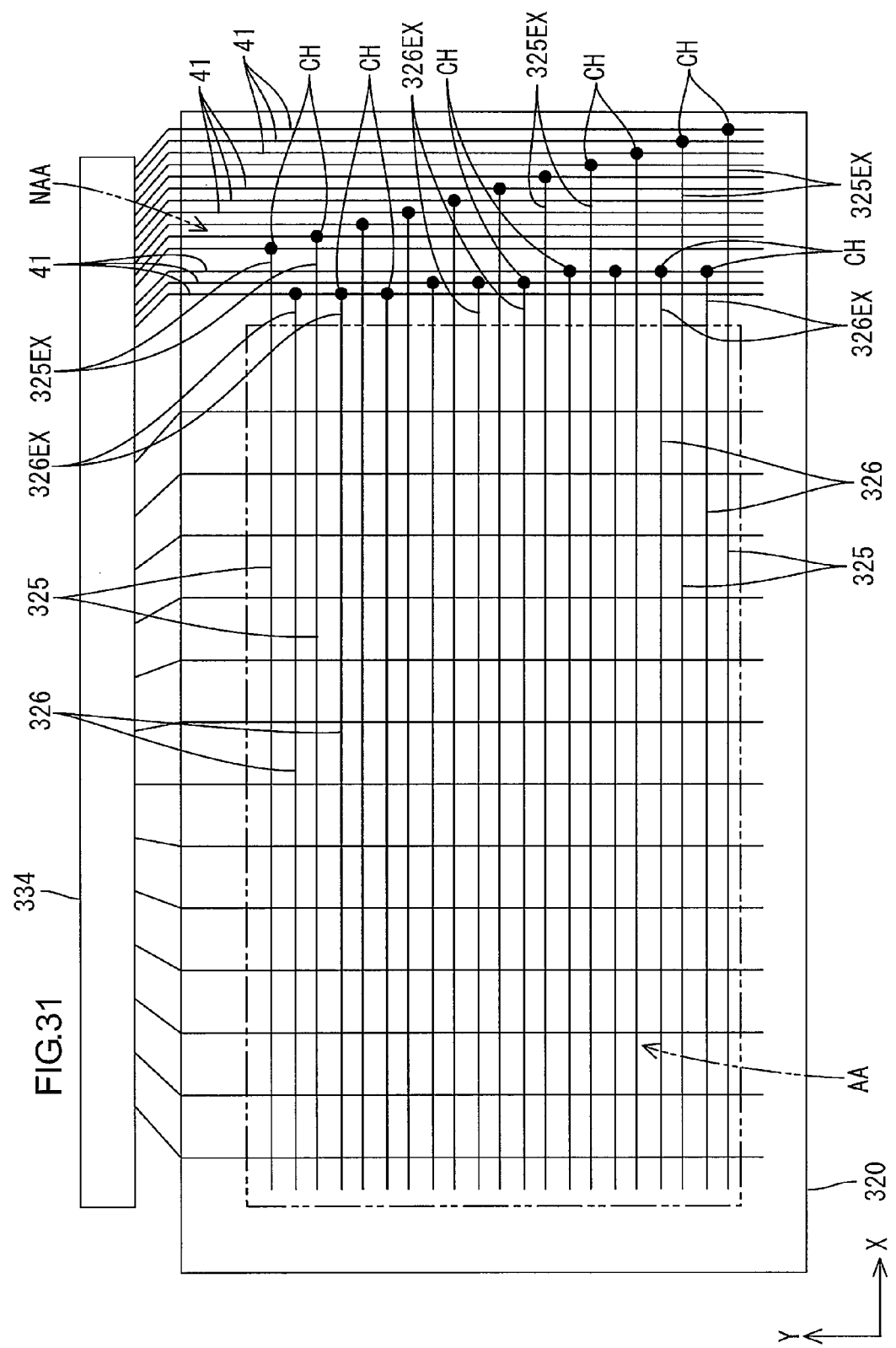
FIG. 31 is a planar view schematically illustrating a wiring configuration in the liquid crystal panel according to the fourth embodiment of the present invention.

According to the present embodiment, as depicted in FIG. 31, a wiring configuration in which gate wires 325 and storage capacitor wires 326 are connected to a source driver 334 without using the gate driver 233 according to the third embodiment described above is adopted. Specifically, on the inner surface side of the array substrate 320, routing wires (the second wires, Cs trunk) 41 are connected to extension portions 325EX of the gate wires 325 and to extension portions 326EX of the storage capacitor wires 326 in the non-display area NAA. The routing wires 41 are also connected to the source driver 334.

The routing wires 41 are disposed in one of the end portions of the array substrate 320 on the short sides thereof in the non-display area NAA, and a plurality of the routing wires 41 extend along the Y-axis direction, namely the direction in which the source wires 24 extend. Specifically, the number of the routing wires 41 connected to the storage capacitor wires 326 is smaller than the number of the storage capacitor wires 326, while the number of the routing wires 41 connected to the gate wires 325 is same as the number of the gate wires 325. The routing wires 41 are provided in the same process by using the same material, and disposed in the same layer (order of stacking) as for the source wires 24. Thus, the routing wires 41 are disposed on the lower side with respect to the gate wires 325 and the storage capacitor wires 326 (the first wires). The routing wires 41 intersect with and traverse the extension portions 325EX of all of the gate wires 325 and the extension portions 326EX of all of the storage capacitor wires 326 via the gate insulating film 29. The gate wires 325 and the storage capacitor wires 326 are electrically connected, via contact holes CH, with the predetermined one of the routing wires 41 with which the respective extension portions 325EX and 326EX intersect. By adopting such a wiring configuration, the source driver 334 can supply a scan signal to the gate wires

325 and also supply a reference potential to the storage capacitor wires 326 via the connected routing wires 41.

As described above, the routing wires 41 intersect with the extension portions 325EX and 326EX of all of the gate wires 325 and the storage capacitor wires 326. Thus, at the intersecting portions of the extension portions 325EX and 326EX intersecting with the routing wires 41, disconnection may be caused by etchant infiltration during the patterning of the routing wires 41. Accordingly, by providing the routing wires 41 with crank portions similar to those according to the first embodiment described above (see FIG. 7) to the intersecting portions of the extension portions 325EX and 326EX, disconnection of the routing wires 41 can be prevented in a preferred manner.

Other Embodiments

The present invention is not limited to the embodiments above described and illustrated with reference to the drawings, and the following embodiments may be included in the technical scope of the present invention.

(1) While according to the embodiments described above, the crank portions are provided to the backup wires, the routing wires, and the like disposed in the non-display area, similar crank portions may be provided to the wires (such as the gate wires and the storage capacitor wires) disposed in the display area, in addition to the wires disposed in the non-display area.

(2) According to the modifications of the first embodiment described above, the recess and the protrusion as the crank portions have a rectangular or square planar shape by way of example, other shapes may be used. Examples of the planar shape for the recess and the protrusion may include a vertically long square, a triangle, a circle, an ellipse, a rhombus, a trapezoid, and polygons with five or more vertices.

(3) According to the modifications of the first embodiment described above, at the side edges of the intersecting portion of the first wire intersecting with the second wire, one or two recesses and protrusions are provided as the crank portions. It is also possible to provide three or more crank portions at the side edges of the intersecting portion of the first wire intersecting with the second wire. In this case, a plurality of recesses and a plurality of protrusions as the crank portions may be alternately disposed side by side at the side edges of the intersecting portion of the first wire intersecting with the second wire, thus forming corrugated or zigzag-shaped crank portions.

(4) According to the modifications of the first embodiment described above, the recesses and protrusions as the crank portions are provided by same number at each of the side edges of the intersecting portion of the first wire intersecting with the second wire. However, it is also possible to vary the number of the crank portions between one and the other of the side edges of the intersecting portion of the first wire intersecting with the second wire.

(5) According to the modifications of the first embodiment described above, the recesses and the protrusions provided as the crank portions at the side edges of the intersecting portion of the first wire intersecting with the second wire all have the same planar shape. However, it is also possible to vary the planar shape of the crank portions between one and the other of the side edges of the intersecting portion of the first wire intersecting with the second wire.

(6) According to the modifications of the first embodiment described above, the recesses and the protrusions provided at the side edges of the intersecting portion of the first wire intersecting with the second wire as the crank portions have the same area. However, it is also possible to vary the area of the crank portions between one and the other of the side edge of the intersecting portion of the first wire intersecting with the second wire. Similarly, it is also possible to vary the measurement of the recesses and protrusions between one and the other of the side edges of the intersecting portion of the first wire intersecting with the second wire.

(7) According to the modifications of the first embodiment described above, the crank portions are provided at both of the side edges of the intersecting portion of the first wire intersecting with the second wire. However, the present invention also includes a configuration in which the crank portions is provided only at one side edge of the intersecting portion of the first wire intersecting with the second wire and no crank portion is provided at the other side edge.

(8) Other than the modifications of the first embodiment described above, the specific arrangement or size (measurement of the sides) of the recesses or protrusions as the crank portions may be modified as needed. For example, the recessed amount of the recesses or the protruding amount of the protrusions may be made approximately one half or not less than one half the line width of the first wire.

(9) According to the first embodiment described above, the backup wires are connected to the source driver. However, the present invention also includes a configuration in which the backup wires are connected to the gate driver.

(10) It is also possible to apply the specific configurations of the crank portions indicated by the modifications of the first embodiment described above to the second to fourth embodiments described above.

(11) The present invention also includes a configuration in which the backup wires described with reference to the first embodiment are eliminated from the configurations according to the second to fourth embodiments described above.

(12) While according to the first embodiment described above the resist film is of positive type, a resist film of the so-called negative type may also be used.

(13) While according to the first embodiment described above, cold cathode tubes are used as the light sources for the backlight unit of the liquid crystal display device, the present invention also includes a configuration in which other light sources, such as hot-cathode tubes or LEDs, are used.

(14) While according to the first embodiment described above, the liquid crystal display device is provided with a backlight unit of direct type by way of example, the present invention also includes a configuration in which a backlight unit of edge light type is used.

(15) While according to the first embodiment described above, the transmission type liquid crystal display device provided with the backlight unit as an external light source is described by way of example, the present invention can also be applied to a reflection type liquid crystal display device that displays by utilizing external light. In this case, the backlight unit may be omitted.

(16) According to the first embodiment described above, the liquid crystal display device has a rectangular display screen by way of example. However, the present invention also includes a configuration in which the liquid crystal display device has a square display screen.

(17) In the foregoing first embodiments, as the switching components of the liquid crystal display device, TFTs are used. The present invention, however, may be applied to liquid crystal display devices using switching components other than TFTs (such as thin-film diodes (TFDs)). Further, the present invention may be applied not only to a liquid crystal display device for color display but also to a liquid crystal display device for monochrome display.

(18) While in the foregoing embodiments liquid crystal display devices using a liquid crystal panel as a display panel has been described by way of example, the present invention may be applied to display devices using other types of display panels (such as a PDP or an organic EL panel).

EXPLANATION OF SYMBOLS

10: Liquid crystal display device (Display device)
11: Liquid crystal panel (Display panel)
12: Backlight unit (Lighting device)
20, 120, 220, 320: Array substrate (Substrate)
21: CF substrate (Substrate)
22: Liquid crystal layer (Liquid crystal)
24: Source wire (Second wire, electrode wire)
24EX: Extension portion
25: Gate wire
26, 126: Storage capacitor wire
27: TFT (Switching component)
27a: Gate electrode (Electrode)
27b: Source electrode (Electrode)
27c: Drain electrode (Electrode)
28: Pixel electrode
32: Backup wire (First wire)
32CP: Intersecting portion
35: Crank portion
36: Recess
37: Protrusion
38: Connecting wire (Second wire)
39: Routing wire (First wire)
40: Routing wire (Second wire)
41: Routing wire (Second wire)
225, 325: Gate wire (First wire)
226, 326: Storage capacitor wire (First wire)
225EX, 325EX: Extension portion
226EX, 326EX: Extension portion
AA: Display area
NAA: Non-display area
NRP: Non-overlapping portion
RP: Overlapping portion
TV: Television device

The invention claimed is:

1. A display device comprising:
a display area configured to display an image;
a non-display area including first regions parallel to each other along first edges of the display area parallel to each other and a second region along a second edge of the display area perpendicular to the first edges;
a plurality of first traces disposed in a first layer of the display device in the first regions and the second region such that each of the plurality of first traces extends along the first edges and the second edge of the display area;
a plurality of second traces disposed in a second layer of the display device and above the first layer, such that ends of each of the plurality of second traces are in the first regions, respectively, and cross over the plurality of first traces, wherein
each of the plurality of first traces includes intersecting portions over which the plurality of second traces cross and at least one rectangular cutout at an edge thereof,
the cutout includes a first edge and a second edge that extend in a longitudinal direction of the second trace and a third edge that extends perpendicular to the longitudinal direction of the second trace, and
the first edge of the cutout is in the intersecting portion of the first trace and the second edge thereof is outside the intersecting portion.

2. The display device according to claim 1, further comprising a plurality of third traces disposed in the first layer in the display area parallel to each other and perpendicular to the plurality of second traces, wherein ends of the plurality of third traces closer to the second region are arranged within the display area.

3. The display device according to claim 1, wherein the first and the second edges of the cutout are shorter than one half a line width of the first trace.

4. The display device according to claim 1, wherein each of the plurality of first traces includes at least one protrusion protruding from the edge thereof in the longitudinal direction of the second trace in the intersecting portion.

5. The display device according to claim 1, wherein
each of the plurality of first traces includes another cutout at the edge thereof, and
the another cutout includes a first edge and a second edge that extend in the longitudinal direction of the second trace and a third edge that extends perpendicular to the longitudinal direction of the second trace, and
the first edge of the cutout is in the intersecting portion of the first trace and the second edge thereof is outside the intersecting portion.

6. The display device according to claim 5, wherein each of the plurality of first traces includes a protrusion protruding from another edge thereof in the longitudinal direction of the second trace in the intersecting portion.

7. The display device according to claim 6, wherein the protrusion has a width equal to a width of the cutout and a height equal to a depth of the cutout.

8. The display device according to claim 6, wherein the protrusion is arranged such that at least a portion of an edge of the protrusion perpendicular to the longitudinal direction of the second trace is within the third edge of the cutout with respect to a width direction of the second trace.

9. The display device according to claim 8, wherein the protrusion has a height equal to a depth of the cutout.

10. The display device according to claim 8, wherein the cutout and the protrusion are arranged such that a midpoint of the third edge of the cutout and a midpoint of the edge of the protrusion are in line along the longitudinal direction of the second trace.

11. The display device according to claim 10, wherein the edge of the protrusion has a length equal to a length of the third edge of the cutout.

12. The display device according to claim 1, further comprising switching components including electrodes in the display area, wherein
the plurality of second traces are electrically connected to the electrodes,
the plurality of first traces are backup lines configured to be electrically connected to respective ones of the plurality of second traces when disconnection occurs in the respective ones of the plurality of second traces.

13. The display device according to claim 1, wherein the plurality of second traces is made of a metal material containing copper.

14. A television device comprising the display device according to claim 1.

* * * * *